United States Patent [19]

Machino

[11] Patent Number: 5,716,458
[45] Date of Patent: Feb. 10, 1998

[54] METHOD OF WASHING AND DRYING AN ARTICLE

[75] Inventor: Katsuya Machino, Chiba-ken, Japan

[73] Assignee: Nikon Corporation, Tokyo, Japan

[21] Appl. No.: 597,106

[22] Filed: Feb. 6, 1996

[30] Foreign Application Priority Data

Feb. 7, 1995 [JP] Japan ................... 7-019110

[51] Int. Cl.⁶ ................... B08B 3/04; B08B 7/00
[52] U.S. Cl. ................... 134/42; 134/1; 134/11; 134/25.4; 134/30; 134/38; 134/40
[58] Field of Search ................... 134/1, 2, 11, 25.4, 134/30, 38, 40, 41, 42

[56] References Cited

U.S. PATENT DOCUMENTS

| | | | |
|---|---|---|---|
| 4,023,931 | 5/1977 | Wolfgram | 436/150 |
| 4,169,807 | 10/1979 | Zuber | 134/38 X |
| 4,591,392 | 5/1986 | Beck | 134/25.4 |
| 4,722,752 | 2/1988 | Steck | 134/25.4 |
| 4,746,397 | 5/1988 | Maeda et al. | 134/32 X |
| 4,788,043 | 11/1988 | Kagiyama et al. | 134/11 X |
| 4,816,081 | 3/1989 | Mehta et al. | 134/30 |
| 4,911,761 | 3/1990 | McConnell et al. | 134/11 |
| 4,977,688 | 12/1990 | Roberson, Jr. et al. | 134/21 X |
| 5,023,010 | 6/1991 | Merchant | 134/38 X |
| 5,030,293 | 7/1991 | Rich et al. | 134/32 |
| 5,087,383 | 2/1992 | Robeck et al. | 134/40 X |
| 5,120,370 | 6/1992 | Mori et al. | 134/22.19 X |
| 5,246,023 | 9/1993 | Breunsbach et al. | 134/109 X |
| 5,413,730 | 5/1995 | Barthelemy et al. | 134/40 X |
| 5,520,744 | 5/1996 | Fujikawa et al. | 134/11 |

FOREIGN PATENT DOCUMENTS 385536  9/1990  European Pat. Off. .

OTHER PUBLICATIONS

L.A.J. Verhoeye *J. Chem. Eng. Data* 1970, 15, 222–226.
Z.M. Kurtyka in "CRC Handbook of Chemistry and Physics" R.C. Weast et al. ed., Boca Raton, Florida: CRC Press, 1982, pp. D1–D33.

*Primary Examiner*—Arlen Soderquist
*Attorney, Agent, or Firm*—Armstrong, Westerman, Hattori, McLeland & Naughton

[57] ABSTRACT

An azeotropic liquid mixture comprising a first component (isopropyl alcohol) and a second component (water) is charged in the washing tank. A heater and a liquid temperature sensor are used to heat the azeotropic liquid mixture in the washing tank to the azeotropic point of the mixture so as to generate a vapor phase mixture forming a vapor layer. A master mask, which is an article to be cleaned, is exposed to the vapor phase mixture in the vapor layer for washing. The vapor phase mixture used for washing is condensed into a condensate, which is removed out of the washing tank through a condensate pan. The master mask is pulled up out of the vapor layer for water-removing and drying.

18 Claims, 7 Drawing Sheets

METHOD OF WASHING AND DRYING AN ARTICLE

BACKGROUND OF THE INVENTION

1. Field of the Invention

The present invention relates to a method of and an apparatus for washing and drying an article, usable for washing and drying a variety of articles including parts and products involved in almost all industrial fields. Especially, the present invention may be advantageously applied, in relation to the fabrication of the electronic devices such as semiconductor devices and liquid crystal displays, to the washing and drying of various types of master masks used in the photolithography process and substrates on which the photolithography process is effected.

2. Related Art

In recent years, more and more personal computers, word processors, television sets and the like have come to use a liquid crystal display panel as the display device. There is also a technical trend toward a liquid crystal display having a larger display area, and accordingly many manufacturers of liquid crystal displays have been developing various techniques for achieving a liquid crystal display having a larger display area.

A typical liquid crystal display consists of two sheets of glass separated by a liquid crystal material which is hermetically sealed-in between the glass sheets by sealant applied along the peripheral regions of the glass sheets, and each glass sheet has a transparent, thin film electrode coating made of indium-tin-oxide (ITO) formed on the inner surface thereof and an orientation layer formed over the electrode coating. The transparent ITO thin film electrode coating is patterned by using a photolithographic technique so that it may be formed in a predetermined shape with necessary precision.

For the photolithography process, there has been widely used a type of projection exposure called the "stepper", which sequentially projects images of the divided areas on a reticle onto a glass substrate, with the adjacent images precisely aligned with each other on the substrate, for example. This technique is called the "step and repeat" technique. Alternatively, there has also been used another type of projection exposure called the "aligner", which transfers a desired pattern formed on a large mask onto a glass substrate by using a scanning projection technique utilizing a mirror projection type of projection optical system.

At present, engineers are attempting to realize a liquid crystal display having a larger display area as well as having a higher resolution (i.e., more dots). The problem of defects in the patterns formed on the substrate, which may be caused by fine particulates adhering to the surfaces of the reticle and/or the substrate, is more serious when the liquid crystal display has a larger display area and/or a higher resolution. A fine dust particulate lying on the surface of the reticle and/or of the substrate may block a part of an exposure light ray, and the image of the particulate may be transferred onto the substrate, so that it may cause a defect in the formation of a pattern having fine features.

There have been disclosed various methods of cleaning reticles, substrates and the like, such as proposed in Japanese Laid-Open Patent Nos. Sho-59-195646 (195646/1984), Hei-5-134397 (134397/1993) and Hei-5-347288 (347288/1993). In the washing methods disclosed in these publications, an article to be cleaned, which may be a reticle or a substrate, is processed through the steps of (a) wetting the article with water or a suitable electrolytic solution with surfactant added thereto for enhancing washing effect while brushing the article with a scrubbing brush to remove relatively large dust particulates, (b) performing an ultrasonic cleaning using a single or a plurality of ultrasonic frequencies to remove fine dust particulates and (c) exposing the article to vapor(s) of organic solvent(s) such as chlorofluorocarbons (CFCs), halons or alcoholic organic solvents so as to achieve the water-removing and drying operation. More recently, with a view to both safety and environmental protection, there has frequently been used a step of immersing a washed article into warm ultrapure water and pulling up it from the surface of the ultrapure water at a very low pull rate, in order to reduce the amount of water adhering to the surface and dry the article.

However, CFCs and halons used as the washing agents have proven to have high ozone-depleting-potentials, so that there are now severe restrictions imposed on their use including those which demand the collection of the used CFCs as well as the many difficult technical problems relating to the protection of the environment and the collection of the used CFCs. Thus, CFCs are continuously being replaced by other washing agents, such as CFC-substitute solvents (including HFC and HCFC), alcoholic organic solvents or ultrapure water. Unfortunately, some CFC-substitute solvents have higher boiling points than CFCs (for example, a typical CFC-substitute solvent "Tekunokea RV-1"(perhaps Tekunokea means "technocare") available from Toshiba Corporation in Japan has a boiling point ranging from 100°–115° C.), so that they have to be handled at a higher temperature when used in the cleaning process. Other CFC-substitute solvents, such as HCFC and HFC, have boiling points as low as CFCs and, at the same time, have low ozone-depleting-potentials. Nevertheless, because their ozone-depleting-potentials are not zero, the use of such CFC-substitute solvents may be possibly prohibited in the near future.

There is used another group of washing agents, i.e., alcoholic organic solvents, such as isopropyl alcohol (IPA). These washing agents generally have lower boiling points than CFC-substitute solvents, and thus seem easy to handle. However, the isopropyl alcohol based washing agents have a closed-cup flash point as low as about 12° C., so that they are classified into class-4 of hazardous materials (alcoholic materials) by Fire Service Law in Japan; they are also at a disadvantage in that they require highly careful treatment for prevention of fire and explosion. Further, because the allowable concentration of isopropyl alcohol is within 400 ppm according to Safety and Health Law in Japan, any isopropyl alcohol based washing agents require severe management in addition to the special care for prevention of fire, resulting in the disadvantage of higher instrumental and maintenance costs.

Under the circumstances described above, warm ultrapure water has become widely used for water-removing and drying of an article as mentioned above. However, it has been found that no ultracleanness effect can be achieved unless various problems are solved, including difficulty in temperature control of the ultrapure water, the need to pull the article up from the ultrapure water at a constant, very low pull rate, possible electrostatical recontamination of the washed article due to its zeta-potential, the need for calmness on the surface of the warm ultrapure water and the possibility that traces of water marks are left on the surface of the dried article.

Further, warm ultrapure water itself is not capable of dissolving grease films and organic dust particulates unlike any of the CFCs, alcoholic organic solvents and CFC-substitute solvents. Thus, any organic dust particulates left on the article surface even after the preceding scrubbing operation and/or ultrasonic washing operation can not be removed during the following water-removing and drying operation using warm ultrapure water alone.

In view of the foregoing, an object of the present invention is to provide a method of washing and drying an article, which method is capable of removing any residual contaminants including organic dust particulates, is harmless to humans and provides safety in respect of fire prevention.

Another object of the present invention is to provide an apparatus for washing and drying an article, which is usable for performing such method of washing and drying an article.

SUMMARY OF THE INVENTION

In accordance with one aspect of the present invention, there is provided a first method of washing and drying an article to be cleaned, comprising the steps of: washing the article by immersing the article in a liquid or vapor phase of an azeotropic mixture prepared by mixing at least two different azeotropic liquids at a predetermined mixing ratio and then drying the article.

In regard to this method, it may be preferable to select the mixing ratio of the azeotropic mixture depending on the condition of the article.

An example of the azeotropic mixture comprises a binary system mixture consisting of water and an alcohol selected from the group of C1–6 alcohols ("C1–6" means that the number of carbon atoms is from 1 to 6).

Another example of the azeotropic mixture comprises a ternary system mixture consisting of water, an alcohol selected from the group of C1–6 alcohols and an ether selected from the group of C2–8 ethers.

In accordance with another aspect of the present invention, there is provided an apparatus for washing and drying an article to be cleaned, comprising: means for mixing at least two different azeotropic liquids at a predetermined mixing ratio into an azeotropic mixture; a washing tank for containing the azeotropic mixture mixed by the mixing means; and means for washing the article by immersing the article in a liquid or vapor phase of the azeotropic mixture in the washing tank, wherein the article is dried after the article is washed by immersing the article in liquid phase or vapor phase of the azeotropic mixture by the washing means.

In accordance with yet another aspect of the present invention, there is provided a second method of washing and drying an article to be cleaned, comprising the steps of: washing the article by immersing the article in liquid phase of an azeotropic mixture prepared by mixing at least two different azeotropic liquids at a predetermined mixing ratio; and drying the article by removing the article from the liquid phase of the azeotropic mixture.

Each of the first and second methods of washing and drying an article according to the present invention, unlike the water-removing and drying technique using warm ultrapure water, requires no tight control of the temperature of the washing liquid and the pull rate of the article to be cleaned, and prevents any electrostatical recontamination of the washed article due to its zeta-potential as well as any trace of water mark left on the surface of the dried article.

Further, warm ultrapure water has no ability to dissolve grease films and organic dust particulates unlike any of the CFCs, alcoholic organic solvents and CFC-substitute solvents. Thus, any organic dust particulates left on the article surface even after the preceding cleaning step(s) can not be removed during the following water-removing and drying step using warm ultrapure water alone. In contrast, each of the methods according to the present invention enables the use of an azeotropic mixture including azeotropic component washing liquid(s) capable of dissolving organic dust particulates, so that any organic dust particulates left on the article surface even after the preceding cleaning step(s) can be easily washed away by immersing the article in liquid phase or vapor phase of the azeotropic washing mixture. In the second method of washing and drying an article to be cleaned, the article is simply immersed in a liquid phase of the azeotropic washing mixture; however it is effective in removing contaminants from the article surface to a substantial extent.

Because the boiling point of the azeotropic mixture is lower than those of the azeotropic component liquids, the use of the azeotropic mixture is particularly advantageous when it is desired to wash a to-be-cleaned article at a relatively low temperature for some reason, one such reason being that the material of the article has poor heat resistance.

Where the mixing ratio of the azeotropic mixture is selected depending on the condition of the article to be cleaned, the selection may be advantageously made by exploiting the fact that each of the component ratios of the vapor phase azeotropic mixture and the liquid phase azeotropic mixture both in the washing tank is selectable. For example, if a considerable number of organic dust particulates are expected to be left on the article surface even after the preceding cleaning step(s), such a washing mixture having an increased proportion of alcoholic or ketonic organic solvent may be used so as to enhance the removal of the residual organic dust particulates during the washing operation. On the other hand, if few organic dust particulates are expected to be left after the preceding cleaning step(s), a different washing mixture having reduced proportion of alcoholic or ketonic organic solvent may be used so as to reduce the consumption of such organic solvent.

Where the azeotropic mixture comprises a binary system mixture consisting of water and an alcohol selected from the group of C1–6 alcohols, this results in the presence of water in each of the liquid phase azeotropic mixture and the vapor phase azeotropic mixture, so that the danger of fire and explosion is significantly reduced thereby leading to a safer operation.

Where the azeotropic mixture comprises a ternary system mixture consisting of water, an alcohol selected from the group of C1–6 alcohols and an ether selected from the group of C2–8 ethers, the danger of fire and explosion is reduced as with the binary system mixture, and further, the mixture's ability to remove organic dusts is enhanced by the inclusion of an ether as one of the components.

In the apparatus for washing and drying an article according to the present invention, an azeotropic mixture is used as the washing mixture and the article to be cleaned is washed in a vapor liquid phase of the mixture while the concentrations of at least two different azeotropic liquids constituting the mixture are controlled by a mixing means to predetermined concentrations, and then the article is dried, so that the apparatus enables the methods to be conveniently carried out according to the present invention.

BRIEF DESCRIPTION OF THE DRAWINGS

The above and other objects, features and advantages of the present invention will be appreciated as the same become better understood by reference to the following detailed descriptions when considered in connection with the accompanying drawings in which.

DETAILED DESCRIPTION OF PREFERRED EMBODIMENTS

Referring now to FIGS. 1 to 4, an embodiment of the present invention will be described. This embodiment shows an exemplified application of the present invention to a washing and drying apparatus for use in the field of semiconductor device fabrication for treating, for example, master masks (such as reticles and mask plates) and substrates (such as wafers and glass plates).

Figure 1:
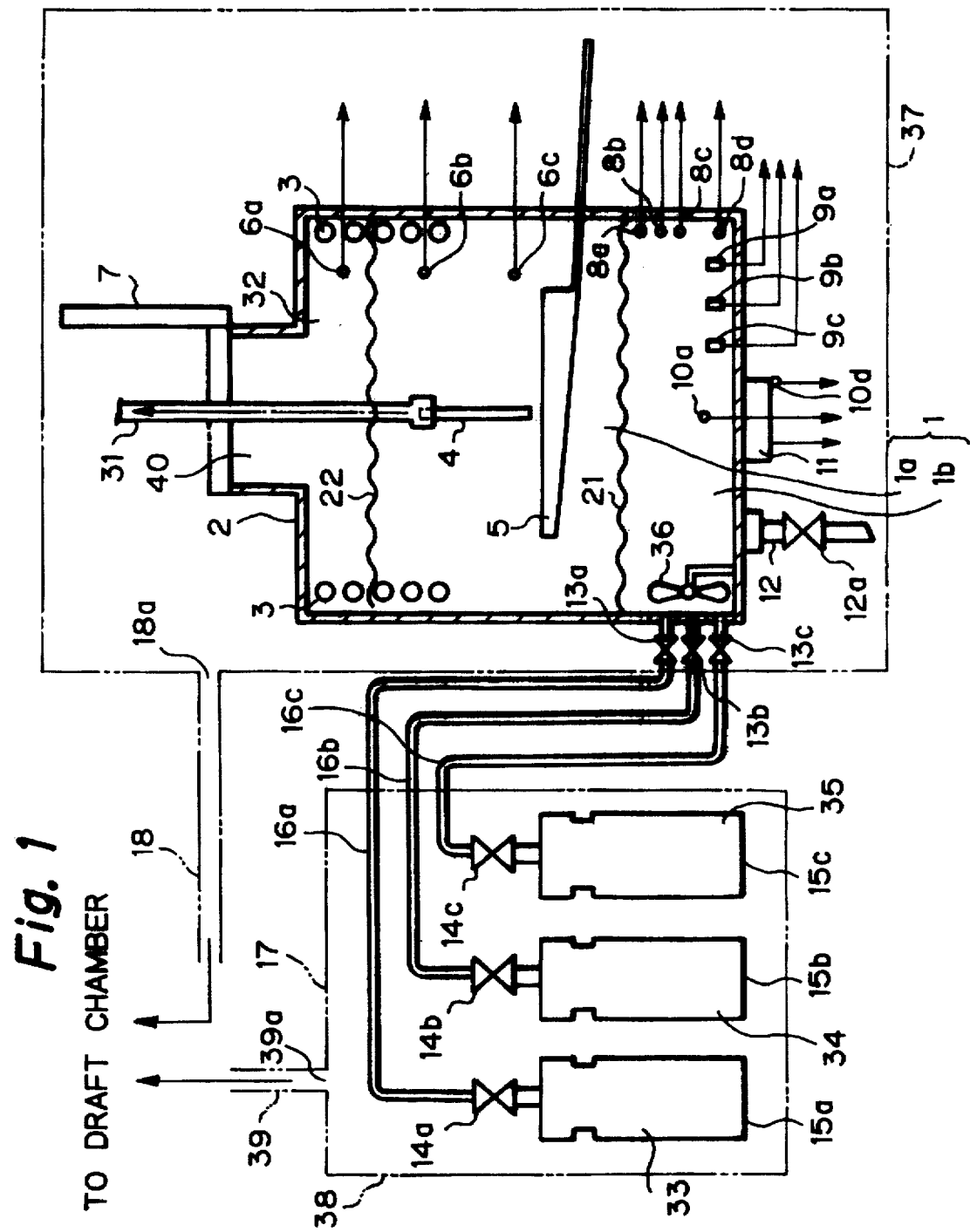
FIG. 1 is a schematic illustrating an embodiment of the apparatus for washing and drying an article according to the present invention in a partially sectional view.

FIG. 1 shows a schematic illustrating the washing and drying apparatus according to the embodiment now being described. As shown, the apparatus comprises a washing tank 2 in which an amount of washing mixture 1 is charged, which forms a lower liquid layer 1b and an upper vapor layer 1a, which are separated by a liquid-gas interface or a liquid surface 21. The washing tank 2 has a top opening 40 and an associated hermetical door 7 for hermetically closing the top opening 40. A master mask 4 may be put in and taken out of the washing tank 2 through the top opening 40. When the door 7 is opened and closed, some atmospheric air flows into the top space 32 in the washing tank 2 to form an air layer, which is substantially separated from the vapor layer 1a of the washing mixture 1 by a gas-gas interface 22. The master mask 4, which is an article to be water-removed and dried, is transferred by a master mask transfer unit 31 along a transfer path represented by a dot-and-dash line with arrow heads into the washing tank 2, and is moved through the vapor layer 1a residing between the liquid surface 21 and gas-gas interface 22, and then through the air layer, for respective predetermined time periods, so as to undergo the water-removing drying operation. FIG. 1 shows the master mask 4 under the washing operation.

There is provided on the bottom wall of the washing tank 2 a heater 11 for heating the washing mixture 1 contained in the tank 2. There are also provided at the bottom of the washing tank 2 a liquid temperature sensor 10a for measuring the temperature of the liquid phase mixture 1 forming the liquid layer 1b. Based on the measurements obtained from the liquid temperature sensor 10a, the operation of the heater 11 is controlled. The heater 11 comprises an electric heater having a heating surface, and the temperature of the heating surface is measured by a heater temperature sensor 10b. The heating surface of the heater 11 directly contacts with the liquid phase mixture 1 forming the liquid layer 1b. If an aberrant rise in temperature of the heating surface occurred so that the heating surface got an extraordinarily high temperature, some of the liquid phase mixture 1 adjacent the heating surface would be exposed to that high temperature and could be degraded thereby. The heater temperature sensor 10b is provided to prevent such degradation of the mixture. The heater temperature sensor 10b may be also used for detection of any aberrant temperature (extraordinarily high or low temperature) of the heater 11 itself. The heater 11 may comprise any of that type of heaters which directly heat the mixture 1 using electricity or other heat sources, or may comprise any of that type of heaters which indirectly heat the mixture 1 using, for example, a heat exchanger which provides heat exchange between the directly heated heat transfer medium and the mixture 1. An indirect heater may be advantageous for avoiding localized heating. Typical heat transfer media suitable for this purpose include low pressure or high pressure steam. Other heat transfer media such as commonly used heat transfer oils and phosphate esters may be also used; the phosphate esters are heat transfer media with high thermostabilities.

There are also provided at the bottom of the washing tank 2 mixture component concentration sensors 9a-9c for detecting the concentrations of individual component washing liquids. The mixture component concentration sensors 9a-9c are used to determine the ratio of the component washing liquids constituting the mixture 1 used in the washing tank 2. The component washing liquids are stored individually in the corresponding reservoir tanks 15a-15c as described later in more detail, and are supplied into the washing tank 2 through respective supply pipes 16a-16c. The supply pipes 16a-16c are connected to respective inlets to the washing tank 2, at which respective supply valves 13a-13c are provided for controlling the supply of the associated component washing liquids into the washing tank 2. The opening/closing operations of the supply valves 13a-13c are controlled based on the information obtained from the mixture component concentration sensors 9a-9c, such that the concentrations of individual component washing liquids in the mixture 1 may be controlled with precision. The concentration control of the component washing liquid may be performed in other ways. For example, the supply valves 13a-13c may be provided with respective flow sensors (not shown), and the concentration control may be performed using the measurements obtained from such flow sensors. Alternatively, the concentration control may performed based on both of the detection means (i.e., the concentration sensors 9a-9c and the flow sensors).

The waste liquid, i.e., used mixture 1, may be disposed or collected through the waste pipe 12 communicating with an outlet provided at the bottom of the washing tank 2. The outlet is provided with a waste valve 12a, which may be opened upon collection of the used mixture 1 or for controlling the liquid level of the mixture 1, when the entire or part of used mixture 1 will be drawn from the washing tank 2 through a pump (not shown).

There are provided in the washing tank 2 and on a side wall thereof a plurality of liquid level sensors 8a-8d, which are mounted at different heights for detecting the level of the liquid surface 21 of the liquid layer 1b. The opening/closing operations of the supply valves 13a-13c are controlled based on the detected results obtained from the liquid level sensors 8a-8d, so as to control the level of the liquid surface 21.

The amounts of component washing liquids charged into the washing tank 2 through the associated supply valves 13a–13c, respectively, are stirred by a stirrer unit 36 into a uniform mixture. The stirrer unit 36 is disposed in the washing tank 2 at the position near the inlets through which the component washing liquids flow into the washing tank 2 and is fixedly mounted on the bottom wall of the washing tank 2. The stirrer unit 36 also helps to achieve a uniform temperature distribution in the liquid phase mixture 1b in the washing tank 2. However, the stirrer unit 36 may not be necessarily used since the uniformity of the mixture 1 may be achieved by the self-dispersion.

There is provided at a relatively upper location in the washing tank 2 a condenser unit 3 for controlling the level of the gas-gas interface 22 between the vapor layer 1a and air to a predetermined height. The condenser unit 3 comprises a length of cooling pipe through which coolant circulates. The upper portion of the vapor layer 1a is cooled by the condenser unit 3 to be condensed into the liquid phase mixture, which returns to the liquid layer 1b. The level of the gas-gas interface 22 defining the upper boundary of the vapor layer 1a rises and falls when the cooling effect of the condenser unit 3 is lowered and raised, respectively. Thus, by appropriately controlling the temperature and/or the flow of the coolant, the level of the gas-gas interface 22 may be maintained at a desired, fixed height. There are provided in the washing tank 2 a plurality of vapor temperature sensors 6a–6c, which are mounted on the side wall of the washing tank 2 at different heights and extends into the air layer or into the vapor layer 1a. The vapor temperature sensors 6a–6c measure the temperature distribution in the vapor layer 1a, and the level of the gas-gas interface 22 is determined based on the measurements obtained from the vapor temperature sensors 6a–6c. Typical coolants usable in the condenser unit 3 include cooling water. A water-glycol mixture also may be used. The coolant may be cooled by a separate cooler unit and caused to circulate through the cooling pipe. Alternatively, it is possible to use an arrangement wherein refrigerant of a refrigerator system is caused to circulate directly through the cooling pipe.

There is also provided above the level of the liquid surface 21 and in the vapor layer 1a in the washing tank 2 a condensate pan 5 positioned near the center location of the washing tank 2 and connected with a drain pipe passing through the side wall of the washing tank 2. The master mask 4 is at lower temperature than the vapor phase mixture in the vapor layer 1a so that a considerable amount of condensates are produced on the surface of the master mask 4. The condensates dissolve any organic dust adhering to the master mask 4 and become waste liquids, which are collected by the condensate pan 5 and drained out of the washing tank 2. Simultaneously, excessive water is condensed and collected by the condensate pan 5 as condensed waste, and removed from the washing tank 2.

The plurality of component washing liquids which are used to constitute the mixture 1 are supplied into the washing tank 2 from the individual reservoir tanks 15a–15c by means of associated pumps (not shown). Instead of the pumps, any suitable compressed air based transfer units may be provided and used to supply the component washing liquids. As the component washing liquid or a first component 33 is stored in the reservoir tank 15a, and a second component 34 and a third component 35 are stored in the reservoir tanks 15b and 15c, respectively. The reservoir tanks 15a–15c communicate with the washing tank 2 through the supply pipes 16a–16c, respectively. The supply pipes 16a–16c are provided with main supply valves 14a–14c, respectively, at the positions near their ends adjacent to the associated reservoir tanks 15a–15c. In the case that the washing mixture 1 to be used is a binary system mixture, one of the three main supply valves 14a–14c is kept closed.

The washing tank 2 is confined within a housing 37 while the reservoir tanks 15a–15c are confined within another housing 38, both housings being schematically shown by the box of imaginary lines in FIG. 1, in order to prevent the vapors involved in the washing and drying Operation from escaping out of the tanks 2 and 15a–15c and dispersing into the atmosphere. The housings 37 and 38 are provided with draft ports 18a and 39a for collecting the escaped vapors. The escaped vapors in the housings 37 and 38 are drawn through draft pipes 18 and 39 connected with the draft ports 18a and 39a, respectively, into a draft chamber (not shown) and are collected there.

All of the measurements and the information obtainable from the various sensors equipped to the washing tank 2, that is, i) the measurements of temperatures obtained from the vapor temperature sensors 6a–6c, the liquid temperature sensor 10a and the heater temperature sensor 10b, ii) the measurements of the concentrations of the azeotropic components in the mixture obtained from the mixture component concentration sensors 9a–9c and iii) the information obtained about the liquid level obtained from the liquid level sensors 8a–8d, are supplied to a central control system (not shown). The central control system is provided with information about the settings required for controlling the washing tank 2, so that it can control the operations of the master mask transfer unit 31, the supply valves 13a–13c and the heater 11, based on the information from the sensors equipped to the washing tank 2.

The embodiment shown is of storage type, that is, it includes the reservoir tanks 15a–15c for storing the component washing liquids. However, other types of apparatus may be contemplated. For example, the apparatus may be modified such that the necessary component washing liquids are supplied directly from the storage system of a plant through the plant's supply lines. Further, a separation system may be used for selective collection of the individual washing liquids so as to enable recycling of the collected washing liquids.

Moreover, an additional mixing tank may be provided between the reservoir tanks 15a–15c and the washing tank 2 for mixing the components. In the mixing tank, the components are temporally stored and the concentrations of the components are adjusted to desired values before the mixture is supplied to the washing tank 2.

Then, the mixed solution 1 is explained in detail. The mixture 1 is an azeotropic mixture which is a multi-component system consisting of two or more components. By way of example, a binary system consisting of isopropyl alcohol ($CH_3CH(OH)CH_3$; also called 2-propanol) and water ($H_2O$) and a ternary system consisting of isopropyl alcohol, isopropyl ether (($CH_3)_2CHOCH(CH_3)_2$; also called diisopropyl ether) and water are here explained.

At first, a binary system using isopropyl alcohol and water is explained.

Isopropyl alcohol is a C3 alcohol which is wholly compatible with water. It is preferable as an example of azeotropic components in this embodiment because it does not decompose water as well as it is less corrosive to metal and relatively safe for human bodies, though when used alone, it may involve a certain risk of fire and explosion.

Figure 2:
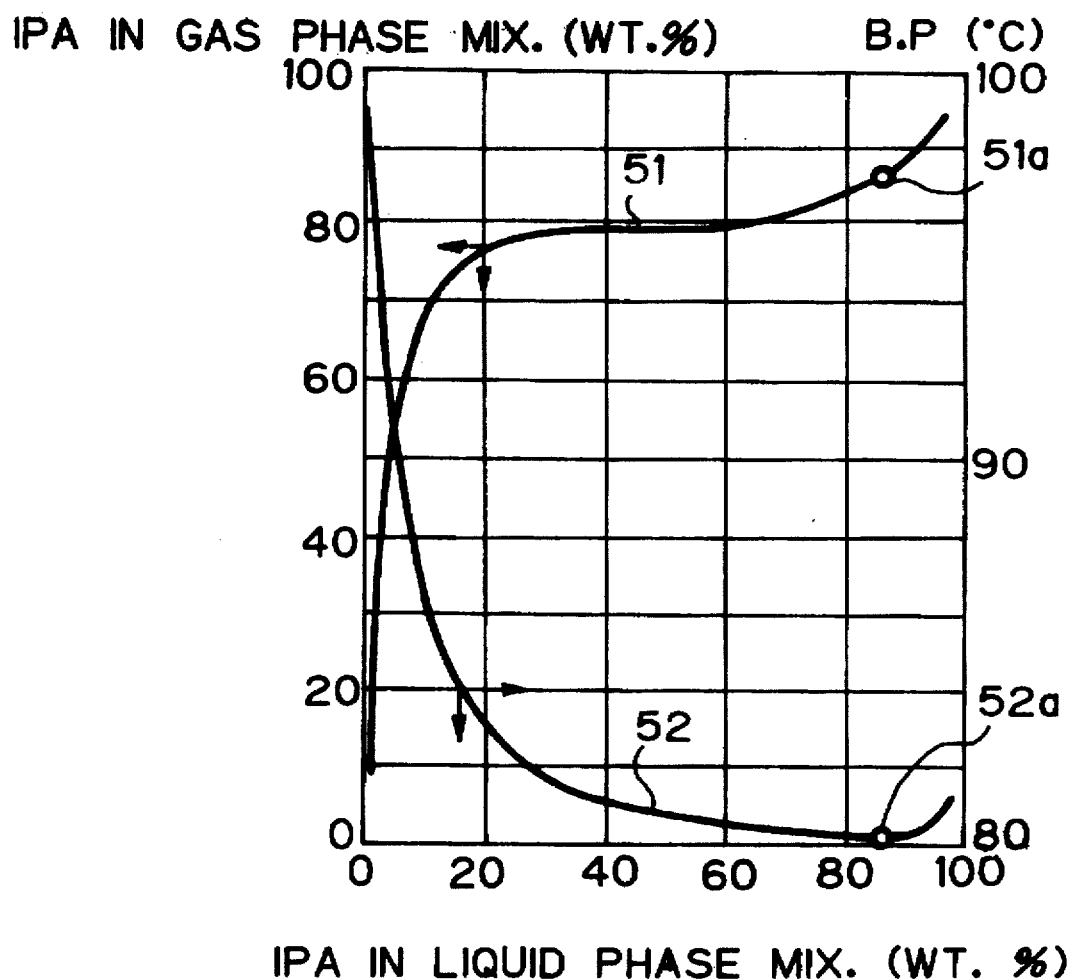
FIG. 2 is a diagram showing the relationship between liquid-gas compositions and boiling points of the isopropyl alcohol-water binary system.

FIG. 2 is a diagram showing the liquid-gas composition and the boiling point of the isopropyl alcohol-water system at normal pressures (see Surface Control & Washing Design, No. 36, 45 (1987)), in which the abscissa represents the concentration (% by weight) of isopropyl alcohol (IPA) in the liquid phase while the ordinate represents the concentration (% by weight) of isopropyl alcohol in the gas phase and the boiling point (° C). In this FIG. 2, the curve 51 shows the relationship between the isopropyl alcohol concentration in the liquid phase and the isopropyl alcohol concentration in the gas phase, and the curve 52 shows the relationship between the isopropyl alcohol concentration in the liquid phase and the boiling point of the isopropyl alcohol-water azeotropic solution. Each of the points 51a, 52a indicated by ○ in the curves 51 and 52 represents the point at which the boiling point of the azeotropic solution is at a minimum (azeotropic point).

As shown by the curve 52, the boiling point of the azeotropic solution rapidly lowers as the isopropyl alcohol concentration in the liquid phase increases. The boiling point lowers to about 83° C. when the isopropyl alcohol concentration in the liquid phase is 20% by weight. On the other hand, the isopropyl alcohol concentration in the gas phase rapidly increases as the isopropyl alcohol concentration in the liquid phase increases. The concentration in the gas phase reaches about 80% by weight when the isopropyl alcohol concentration in the liquid phase is 20% by weight. Once the isopropyl alcohol concentration in the liquid phase exceeds 20% by weight, the boiling point begins to slowly lower. The boiling point of the azeotropic solution reaches the minimum azeotropic point (79.5° C. ) when the isopropyl alcohol concentration in the liquid phase is 87.8% by weight. This azeotropic point is lower than the boiling point of isopropyl alcohol itself (82.4° C. ). Thus the conditions for high-temperature treatment are less strict than those for handling isopropyl alcohol alone, and the presence of water remarkably reduces the risk of fire.

In this way, the both of the isopropyl alcohol concentration in the gas phase and the boiling point nearly approach those observed at the azeotropic point which occurs at the isopropyl alcohol concentration of 87.8% by weight, once the isopropyl alcohol concentration in the liquid phase exceeds about 20% by weight. Thus, the purpose of washing and drying a wash in a gas phase, for example, can be attained in almost the same conditions once the isopropyl alcohol concentration in the liquid phase exceeds 20% by weight.

If the master mask 4 to be washed in this embodiment has a low heat resistance, washing and hydro-extraction are carried out at the minimum azeotropic point. If the master mask 4 has a substantial heat resistance, however, the proportion of each component is varied depending on the degree of the heat resistance thereof to vary the temperature during steam drying. In other words, washing and drying operations are carried out by varying the isopropyl alcohol concentration at will depending on the nature of the wash, the state and nature of soil on the wash, safety, etc. The range of the isopropyl alcohol concentration in the azeotropic mixture used in this embodiment is about 10 to 90% by weight, especially preferably 20 to 88% by weight.

Although the isopropyl alcohol-water system has been specifically explained as an example of binary systems, various binary azeotropic mixtures can be used in the washing and drying method and the washing and drying apparatus according to this invention. Representative examples thereof are listed in Table 1 below.

TABLE 1

Binary azeotropic mixtures

| First component | Second component | $\theta_b$(°C.) | $W_2$ |
|---|---|---|---|
| 2-Propanol | Water | 79.5 | 12.2 |
| | Benzene | 71.9 | 66.7 |
| | Cyclohexane | 68.6 | 67 |
| | n-Heptane | 76.4 | 49.5 |
| | Hexane | 62.7 | 77 |
| | Octane | 81.8 | 16 |
| | Toluene | 80.6 | 31 |
| | Carbon tetrachloride | 67.0 | 82 |
| | Chloroform | 60.8 | 4.2 |
| | Ethylene chloride | 72.7 | 60.8 |
| | Perchloroethylene | 81.7 | 19 |
| | Trichloroethylene | 74.0 | 72 |
| | Isopropyl ether | 66.2 | 83.7 |
| | Methyl ethyl ketone | 77.3 | 70 |
| | Ethyl acetate | 74.0 | 74 |
| | Isopropyl acetate | 80.1 | 47.7 |
| | Methyl acrylate | 76.0 | 53.5 |
| | Vinyl acetate | 70.8 | 77.6 |
| | Acrylonitrile | 71.7 | 56 |
| | Carbon bisulfide | 44.6 | 92 |
| Acetone | Isoprene | 30.5 | 0.20 |
| | Isopentane | 25.7 | 0.12 |
| | Propyl chloride | 45.8 | 0.15 |
| | Methyl acetate | 55.8 | 0.39 |
| | Diisopropyl ether | 54.2 | 0.61 |
| | Diethylamine | 51.39 | 0.382 |
| | Cyclohexane | 53.0 | 0.675 |
| | Cyclopentane | 41.0 | 0.36 |
| | 2,3-Dimethylbutane | 46.3 | 0.42 |
| | Hexane | 49.8 | 0.268 |
| | Pentane | 32.5 | 0.20 |
| | Methylcyclopentane | 50.3 | 0.57 |
| Ethanol | Ethyl acrylate | 77.5 | 0.727 |
| | Methyl acrylate | 73.5 | 0.424 |
| | Ethyl propyl ether | 61.2 | 0.25 |
| | Isobutyl chloride | 61.45 | 0.163 |
| | Butyl chloride | 65.7 | 0.203 |
| | t-Butyl chloride | 49 | 0.065 |
| | Ethyl acetate | 71.81 | 0.3095 |
| | Thiophene | 70.0 | 0.45 |
| | Toluene | 77.0 | 0.692 |
| | Benzene | 67.9 | 0.314 |
| Ethylenediamine | Isobutyl alcohol | 120.5 | 0.50 |
| | Toluene | 104 | 0.308 |
| | 1-Butanol | 124.7 | 0.357 |
| Thiophen | Cyclohexane | 77.90 | 0.412 |
| | 2,3-Dimethylpentane | 80.90 | 0.64 |
| | 2,4-Dimethylpentane | 76.58 | 0.427 |
| | Hexane | 68.46 | 0.112 |
| | Heptane | 83.09 | 0.832 |
| | Methylcyclopentane | 71.47 | 0.140 |
| Pyridine | Octane | 109.5 | 0.561 |
| | 2,2,4-Trimethylpentane | 95.75 | 0.234 |
| | Piperidine | 105.8 | 0.34 |
| | Phenol | 183.95 | 0.796 |
| | Heptane | 95.60 | 0.253 |
| 1-Heptanol | Dipentene | 171.7 | 0.50 |
| | p-Methylanisole | 173.3 | 0.52 |
| | N,N-Dimethyl-O-toluidine | 175.5 | 0.82 |
| | Cymene | 172.5 | 0.47 |
| Methanol | Acrylonitrile | 61.4 | 0.613 |
| | Acetonitrile | 63.45 | 0.19 |
| | Acetone | 55.5 | 0.12 |
| | Isopentane | 24.5 | 0.04 |
| | Ethyl methyl ketone | 64.3 | 0.711 |
| | Diethylamine (740 mmHg) | 66.2 | 0.40 |
| | Cyclohexane | 54.55 | 0.39 |
| | Tetrachloroethylene | 63.75 | 0.635 |
| | Tetrahydrofuran (740 mmHg) | 59.1 | 0.311 |
| | Toluene | 63.8 | 0.714 |
| | Benzene | 57.50 | 0.391 |
| Water | Acrylic aldehyde | 52.4 | 0.026 |
| | Ethyl acrylate | 81.1 | 0.15 |
| | Acrylonitrile | 70.6 | 0.143 |
| | Acetylacetone | 94.4 | 0.41 |

TABLE 1-continued

Binary azeotropic mixtures

| First component | Second component | θ_b(°C.) | W_2 |
|---|---|---|---|
| Water | Anisole | 95.5 | 0.405 |
| | Aniline (742 mmHg) | 98.6 | 0.808 |
| | Ethyl benzoate | 99.40 | 0.840 |
| | Ethanol | 78.174 | 0.040 |
| | 1-Octanol | 99.4 | 0.90 |
| | 2-Octanol | 98 | 0.73 |
| | Octane | 89.6 | 0.255 |
| | Formic acid | 107.65 | 0.255 |
| | Chlorobenzene | 90.2 | 0.284 |
| | Chloroform | 56.1 | 0.028 |
| | Ethyl acetate | 70.5 | 0.0788 |
| | Methyl acetate | 56.0 | 0.696 |
| | Carbon tetrachloride | 66 | 0.041 |
| | 174-Dioxane | 35.0 | 0.1068 |
| | Cyclohexanol | 97.8 | 0.695 |
| | Cyclohexanone | 96.3 | 0.55 |
| | Cyclohexane | 69.5 | 0.084 |
| | Didecane | 99.45 | 0.98 |
| | Trimethylamine | 75.5 | 0.10 |
| | Toluene | 85.0 | 0.1991 |
| | Naphthalene | 98.8 | 0.84 |
| | Nitroethane | 87.22 | 0.285 |
| | Pyridine | 93.6 | 0.413 |
| | Phenol | 99.52 | 0.9079 |
| | 1-Butanol | 92.7 | 0.405 |
| | 2-Butanol | 87.0 | 0.270 |
| | Furfuryl alcohol | 98.5 | 0.80 |
| | 1-Propanol | 87.65 | 0.285 |
| | 1-Hexanol | 97.8 | 0.672 |
| | Hexane | 61.6 | 0.056 |
| | Hexylamine | 95.5 | 0.49 |
| | 1-Heptanol | 98.7 | 0.83 |
| | 3-Heptanone | 94.6 | 0.422 |
| | 4-Heptanone | 94.3 | 0.405 |
| | Benzene | 69.25 | 0.0883 |
| | 1-Pentanol | 95.8 | 0.544 |
| | 2-Pentanol | 91.7 | 0.365 |
| | Methyl methacrylate | 83 | 0.14 |
| | 2-Methylpyridine | 93.5 | 0.48 |
| | 3-Methylpyridine | 97 | 0.60 |
| | 4-Methylpyridine | 97.35 | 0.628 |
| | Methyl butyrate | 82.7 | 0.115 |

Note: θ_b represents the azeotropic point and W_2 represents the mass fraction of the second component. The values with * are expressed in molar %.

As shown in Table 1, all the components except for water (H_2O) of binary azeotropic mixtures are organic hydrocarbons. Among those, chlorinated hydrocarbons such as tetrachloroethylene or carbon tetrachloride may not be suitable examples used in the binary system of this embodiment due to the environmental problems they raise now, even though they have previously been used for washing applications in every field because they are non-combustible, readily remove organic soils and show excellent drying characteristics. However, they were specially listed to typically show the feature of this embodiment. In the washing and drying method using azeotropic components according to this embodiment, more specifically the method of washing and drying a wash in a gas phase of an azeotropic mixture, these non-combustible components such as tetrachloroethylene or hydrocarbon tetrachloride can be used in the gas phase primarily because they provide azeotropic points extremely lower than the boiling point of each of those components.

If a gas phase of, for example, tetrachloroethylene which has the boiling point of 121.2° C. is to be used alone, it is necessary to solve the problems of high-temperature treatment. However, the method of this embodiment allows these non-combustible components to be used in a gas phase by employing the tetrachloroethylene-methanol binary system mentioned in Table 1 to lower the azeotropic point to 63.75° C.

If a wash is soaked in washing liquid, the dust on the surface of the wash contaminates the washing liquid and thus makes it necessary to change or regenerate said liquid. Even if washing is carried out in a gas phase and a little amount of waste liquid containing the dust from the surface of the wash is removed outside, the liquid phase will not be contaminated and thus its life will be largely extended. In other words, even environmentally detrimental or expensive components can be very advantageously employed according to the washing and drying method of this embodiment.

The above examples of binary systems which comprise low-carbon organic hydrocarbons with 1 to 10 carbon atoms involve the risk of fire or explosion when they are water-free. However, an ethanol-toluene system, for example, has the azeotropic point of 77.0° C. which is remarkably lower than the boiling point of toluene, while the respective components have the boiling points of 78.32° C. and 110.6° C. Therefore, such a binary system is very advantageous if the washing power of toluene is to be taken advantage of in a gas phase.

C1-6 alcohols are preferable as components of the binary system of this embodiment, because they involve less risk of explosion, lower boiling points and improved volatility as compared with other organic components. Among the above binary mixtures, particularly preferred are binary azeotropic mixtures consisting of water and an alcohol selected from the group of C1-6 alcohols in view of the reduced risk of fire and explosion.

The above azeotropic mixtures are selected depending on the material of the wash and the state of soil, the desired finished state of the wash, environmental conditions, etc. As explained above for the isopropyl alcohol-water binary system, each pair of components of the above binary azeotropic mixtures may not be limitatively used in the proportion (mass fraction) at the minimum boiling point, namely the azeotropic point, but washing and hydro-extraction are carried out by varying the concentrations of each pair of components at will depending on the state of soil on the wash, the nature of the soil, safety, etc.

Then, a ternary system using isopropyl alcohol, isopropyl ether and water is explained.

When fats and oils which are difficult to remove by water or alcohols are deposited on a wash, aromatics such as benzene or toluene, low-carbon hydrocarbons or ketones are used. If one wished to use these components in coexistence with water, for example, to fulfil the purpose of this embodiment of reducing the risk of fire and explosion or maintaining good hygiene, however, most of them could not form azeotropic mixtures with water in wide concentration ranges. In such cases, alcohols can be added as third components to form azeotropic mixtures in wide concentration ranges.

Isopropyl ether is a relatively safe, hygienic and widely available product which readily removes fats and oils, and thus can form an effective ternary azeotropic mixture with isopropyl alcohol, isopropyl ether and water to fulfil the purpose of this embodiment. The azeotropic point of this isopropyl alcohol-isopropyl ether-water ternary azeotropic mixture is 61.5° C. which is lower than the boiling point of water by about 38.5° C. and also lower than the boiling points of isopropyl alcohol and isopropyl ether by 22.5° C. and 7° to 7.5° C., respectively. The proportion of isopropyl alcohol, isopropyl ether and water at the azeotropic point is 7.3:88:4.7 by weight.

When the above ternary system is used in this embodiment, washing and hydro-extraction are carried out by varying the concentration of each component at will depending on the nature of the wash, the state of soil on the wash, the nature of the soil, safety, etc., in the same way as binary systems. The same applies to the other ternary systems mentioned below. Ternary systems are more advantageous especially when the master mask 4 has a low heat resistance because the azeotropic points can be further lowered as compared with those of binary systems.

Although the isopropyl alcohol-isopropyl ether-water system has been specifically explained as an example of ternary systems, various ternary azeotropic mixtures can be used in the washing and drying method and the washing and drying apparatus according to this invention. Representative examples thereof are listed in Table 2 below.

TABLE 2

Ternary azeotropic mixtures

| First component | Second component | Third component | $\theta_b$ (°C.) | $W_2$ | $W_3$ |
|---|---|---|---|---|---|
| 2-Propanol | Water | Benzene | 66.5 | 7.5 | 73.8 |
| | Water | Cyclohexane | 64.8 | 7.5 | 74 |
| | Water | Cyclohexane | 61.1 | 7.5 | 71 |
| | Water | Diisobutylene | 72.3 | 10 | 9.3 |
| | Water | Toluene | 76.3 | 13.1 | 48.7 |
| | Water | Ethylene chloride | 69.7 | 7.7 | 73.3 |
| | Water | Ethyl butyl ether | 73.4 | 10.4 | 67.7 |
| | Water | Isopropyl ether | 61.6 | 4.7 | 88 |
| | Water | Isopropyl acetate | 75.5 | 11 | 76 |
| | Water | Nitromethane | 78.0 | 6 | 32 |
| Isobutyl alcohol | 1,4-Dioxane | Toluene | 101.8 | 0.443 | 0.290 |
| | Pyridine | Toluene | 108.7 | 0.226 | 0.634 |
| | Benzene | Cyclohexane | 76.73 | 43* | 48* |
| Ethanol | Benzene | Cyclohexane | 65.06 | 9.2* | 46.7* |
| | Benzene | Heptane | 32.38 | 64.6* | 2.2* |
| Methyl formate | Diethyl ether | Pentane | 20.4 | 0.08 | 0.52 |
| | Ethyl bromide | Isopentane | 16.95 | 0.05 | 0.43 |
| Chloroform | Methanol | Acetone | 57.5 | 0.23 | 0.30 |
| Acetic acid | 2,4-Dimethylpyridine | Undecane | 162.0 | 69.9* | 7.2* |
| | Pyridine | Ethylbenzene | 129.08 | 0.252 | 0.613 |
| | Pyridine | O-Xylene | 132.2 | 33.0* | 41.8* |
| | Acetic anhydride | Pyridine | 134.4 | 0.23 | 0.22 |
| | 2-Methylpyridine | Octane | 121.4 | 27.9* | 65.8* |
| 1-Butanol | Benzene | Cyclohexane | 77.42 | 50* | 46* |
| 1-Propanol | Benzene | Cyclohexane | 73.78 | 0.28 | 0.49 |
| 2-Propanol | Ethyl acetate | Cyclohexane | 68.3 | 0.244 | 0.511 |
| | Benzene | Cyclohexane | 69.1 | 0.142 | 0.474 |
| Methanol | Methyl acetate | Cyclohexane | 50.8 | 0.486 | 0.336 |
| | Ethyl bromide | 2-Methyl-2-butene | 31.4 | 0.55 | 0.30 |
| HCl | Chlorobenzene | Water | 96.9 | 0.745 | 0.202 |
| | Phenol | Water | 107.33 | 0.194 | 0.648 |
| Water | Acetone | Isoprene | 32.5 | 0.076 | 0.920 |
| | Acetone | Carbon disulfide | 38.04 | 0.2398 | 0.7521 |
| | Acetonitrile | Benzene | 66 | 0.233 | 0.685 |
| | Allyl alcohol | Hexane | 59.9 | 0.051 | 0.864 |
| | Allyl alcohol | Benzene | 68.21 | 0.0916 | 0.8226 |
| | Isobutyl alcohol | Isobutyl formate | 80.2 | 0.067 | 0.76 |
| | Isobutyl alcohol | Isobutyl chloroacetate | 90.2 | 0.531 | 0.1326 |
| | Isobutyl alcohol | Isobutyl acetate | 86.8 | 0.231 | 0.465 |
| | Isobutyl alcohol | Dibutyl ether | 90.6 | 0.346 | 0.355 |
| | Ethanol | Ethyl chloroacetate | 81.35 | 0.617 | 0.208 |
| | Ethanol | Ethyl acetate | 77.1 | 0.483 | 0.416 |
| | Ethanol | Triethylamine | 74.7 | 0.13 | 0.78 |
| | Ethanol | Hexane | 56.4 | 0.274 | 0.614 |
| | Ethanol | Benzene | 64.86 | 0.185 | 0.741 |
| | Ethanol | Methylcyclohexane | 69.59 | 0.418 | 0.358 |
| Water | Ethyl methyl ketone | Hexane | 55 | 0.22 | 0.77 |
| | Ethyl methyl ketone | Benzene | 68.2 | 0.261 | 0.651 |
| | Formic acid | Acetic acid | 107.05 | 49.1* | 15.4* |
| | 1,2-Dichloroethane | Ethanol | 67.8 | 0.771 | 0.157 |
| | Trichloroethylene | Ethanol | 67 | 0.784 | 0.161 |
| | Nitromethane | Octane | 77.35 | 40.5* | 21.1* |
| | 1-Butanol | Butyl chloroacetate | 93.1 | 0.503 | 0.079 |
| | 1-Butanol | Dibutyl ether | 90.92 | 0.406 | 0.294 |
| | 2-Butanol | Heptane | 75.8 | 19.0* | 42.5* |
| | 2-Butanol | Methylcyclohexane | 77.1 | 17.9* | 41.4* |
| | t-Butyl alcohol | Cyclohexane | 65 | 0.21 | 0.71 |
| | t-Butyl alcohol | Benzene | 67.30 | 0.214 | 0.705 |
| | 1-Propanol | Cyclohexane | 66.6 | 0.100 | 0.815 |
| | 1-Propanol | Dipropyl ether | 74.8 | 0.202 | 0.681 |
| | 3-Methyl-1-butanol | Isopentyl acetate | 93.6 | 0.312 | 0.24 |
| | 2-Methoxyethanol | Ethylbenzene | 90.1 | 0.074 | 0.672 |

Note: $\theta_b$ represents the azeotropic point, and $W_2$ and $W_3$ represent the mass fractions of the second and third components, respectively. The values with * are expressed in molar %.

In Table 2, the azeotropic point of the ternary system consisting of ethanol (b.p. 78.3° C.), benzene (b.p. 80.1° C.) and heptane (b.p. 98.4° C.) is 32.38° C., which is remarkably lower than the boiling point of each component. The azeotropic point of the ternary system consisting of $H_2O$ (b.p. 100° C.), ethanol (b.p. 78.32° C.) and hexane (b.p. 68.74° C.) is also lowered to 56.4° C.

As has been described above, the azeotropic points of ternary systems can be further lowered as compared with those of binary systems. In the same way as explained for binary systems, the components which are difficult to use alone can be effectively employed as washing components by using ternary azeotropic mixtures.

As shown in Table 2, various alcohols can be used as components of ternary azeotropic mixtures. Among those, C1–6 alcohols are particularly preferred as components of the ternary system of this embodiment, because they are safer in respect of fire and hygiene, and have lower boiling points and better volatility than other organic hydrocarbons. C2–8 ethers have high power of dissolving fats and oils as well as good volatility, and can be used in wide concentration ranges to form ternary azeotropic mixtures with alcohol and water. Among the above ternary azeotropic mixtures, particularly preferred are ternary azeotropic mixtures consisting of an alcohol selected from the group of C1–6 alcohols, an ether selected from the group of C2–8 ethers and water because of the reduced risk of fire or explosion.

Next, the operation of the washing and drying apparatus according to the embodiment of FIG. 1 will be described with reference to two exemplified operation sequences, one using a binary system washing mixture and the other using a ternary system washing mixture. In the first example, the binary system washing mixture consists of isopropyl alcohol as the first component 33 and water as the second component 34. In the second example, the ternary system washing mixture consists of isopropyl alcohol as the first component 33, isopropyl ether as the second component 34 and water as the third component 35. In either of the washing mixture, the water is ultrapure water.

I) Exemplified operation sequence using a binary system washing mixture of isopropyl alcohol-water:

In this example, it is assumed that the master masks 4 to be treated have a relatively low heat resistance. Thus, the operation factors are set such that the treatment is carried out at a temperature near the azeotropic point (79.5° C.) of the isopropyl alcohol-water binary system. In FIG. 1, the reservoir tank 15a is filled with isopropyl alcohol while the reservoir tank 15b with ultrapure water. The third reservoir tank 15c is not used and thus the associated main supply valve 14c will be kept closed. Then, the main supply valves 14a and 14b are opened to supply appropriate amounts of isopropyl alcohol and ultrapure water through the supply pipes 16a and 16b, respectively, into the washing tank 2 so as to achieve a predetermined ratio of these component liquids. In this example, the amount of isopropyl alcohol supplied from the reservoir tank 15a through the supply pipe 16a into the tank 2 and the amount of ultrapure water supplied from the reservoir tank 15b through the supply pipe 16b into the tank 2 are such that the resulting mixture in the washing tank 2 contains about 88% by weight of isopropyl alcohol and about 12% by weight of ultrapure water. The amounts of the component liquids supplied into the washing tank 2 are stirred by the stirrer unit 36 fixedly mounted on the bottom wall of the washing tank 2 into a uniform mixture. The supply of each component liquid is controlled to the desired amount through the operation of the associated one of the supply valves 13a and 13b. The supply valves 13a and 13b serve to adjust the level of the liquid layer 1b represented by the measurements from the liquid level sensors 8a–8d, as well as adjust the concentrations of the component liquids represented by the measurements from the mixture component concentration sensors 9a and 9b.

When it is detected by the liquid level sensors 8a–8d that the desired amount of washing mixture has been charged in the washing tank 2, the heater 11 is activated based on the signal provided from the sensors 8a–8d to start heating the washing mixture. As the washing mixture is heated to be warmer and warmer, vapors of the component liquids are generated resulting in the change in the ratio of the components in the liquid phase washing mixture forming the liquid layer 1b. Accordingly, the supply valves 13a and 13b are continuously operated for fine control to maintain the ratio of the components in the liquid phase mixture at the desired fixed ratio as well as the level of the liquid surface 21 of the liquid layer 1b at the desired fixed level, until the washing mixture is heated by the heater 11 to reach the azeotropic point thereof.

This azeotropic point is 79.5° C., which is lower than the boiling point of a single liquid of water by about 20° C. and lower than even the boiling point of a single liquid of isopropyl alcohol by about 3° C. While the generated vapor phase washing mixture tends to disperse upwardly toward the top of the washing tank 2, the gas-gas interface 22 between the vapor layer 1a and the air layer (i.e., the upper boundary of the vapor layer 1a) is controlled to a desired fixed level by means of the condenser unit 3, and in the vapor layer 1a has a isopropyl alcohol concentration of more than 80% by weight under this condition. The condensates of the vapors of the components condensed by the condenser unit 3 return into the liquid layer 1b in the bottom of the washing tank 2 and are heated again.

When it is determined, based on the measurements obtained from the liquid temperature sensor 10a, the heater temperature sensor 10b and the vapor temperature sensors 6a–6c, that the condition in the washing tank 2 has been stabilized, the hermetical door 7 is opened, and the master mask 4, which is the article to be cleaned, is put in the washing tank 2 and lowered to a position between the liquid surface 21 and the gas-gas interface 22 by means of the master mask transfer unit 31. The temperature of the master mask 4 is lower than the vapor phase of mixture in the vapor layer 1a, so that considerable condensate is produced on the surface of the master mask 4, which condensate dissolves any organic dust adhered on the master mask 4 so as to be waste liquid, which is collected by the condensate pan 5 and drained out of the washing tank 2. Simultaneously, any water adhered to the master mask 4 may be dissolved by the condensate produced from the mixed vapors of the components and removed from the master mask 4. After a predetermined time period, the master mask transfer unit 31 takes the master mask 4 out of the washing tank 2, when any water has been removed from the surface of the master mask 4, and the condensate then adhered to and wetting the surface of the master mask 4 consists mainly of isopropyl alcohol, which vanishes out by evaporation during the transfer of the master mask 4 out of the washing tank 2 because it has a high volatility, and the master mask 4 accordingly dries soon. In this manner, the master mask 4 is washed and dried.

In this example, the washing mixture 1 is the isopropyl alcohol-water binary system prepared as the liquid phase mixture consisting of about 88% by weight of isopropyl alcohol and about 12% by weight of ultrapure water, as described above. However, the washing mixture 1 is not limited to the mixture of this composition. For example, if the master masks 4 have good heat resistance, treatment may be carried out at any of the operational points other than the azeotropic point at which the boiling point of the mixture has a minimum. Thus, we may select the operating point to be some other point with a higher concentration of water than the azeotropic point, which allows the washing and drying operation at higher safety level. As mentioned above, if an isopropyl alcohol-water washing mixture contains more than about 20% by weight of isopropyl alcohol, the vapor phase of the washing mixture contains isopropyl alcohol at the concentration nearly equal to that of an isopropyl alcohol-water mixture at the azeotropic point, and the washing and drying operation using that washing mixture can be performed at a boiling point nearly equal to the azeotropic point.

II) Exemplified operation sequence using a ternary system washing mixture of isopropyl alcohol-isopropyl ether-water:
In this example, the washing and drying operation is performed in a manner similar to that of the previous example using a binary system washing mixture. In FIG. 1, the reservoir tank 15a is filled with isopropyl alcohol, the reservoir tank 15b with ultrapure water and the reservoir tank 15c with isopropyl ether. In this example, like the previous one, the operating factors are selected such that the water-removing and drying operation is carried out at the azeotropic point of the ternary system in order to keep the boiling point or the washing mixture 1 as low as possible.

Appropriate amounts of isopropyl alcohol, ultrapure water and isopropyl ether are supplied from the reservoir tanks 15a–15c through the supply pipes 16a–16c, respectively, into the washing tank 2, such that the resulting mixture may contain about 7.3% by weight of isopropyl alcohol, about 4.7% by weight of ultrapure water and about 88% by weight of isopropyl ether. The amounts of these component liquids supplied into the washing tank 2 are stirred by the stirrer unit 36 fixedly mounted on the bottom wall of the washing tank 2 into a uniform mixture. The supply of each component liquid is controlled to a desired amount through the operation of the associated one of the supply valves 13a–13c. The supply valves 13a–13c serve to adjust the level of the liquid layer 1b represented by the measurements from the liquid level sensors 8a–8d, as well as adjust the concentrations of the component liquids represented by the measurements from the mixture component concentration sensors 9a–9c.

When it is detected by the liquid level sensors 8a–8d that the desired amount of washing mixture has been charged in the washing tank 2, the heater 11 is activated to start heating the washing mixture. As the washing mixture becomes warmer and warmer, vapors of the component liquids are generated resulting in a change in the ratio of the components in the liquid phase washing mixture forming the liquid layer 1b. Accordingly, the supply valves 13a–13c are continuously operated for fine control to maintain the ratio of the components in the liquid phase mixture at the desired fixed ratio as well as the level of the liquid surface 21 of the liquid layer 1b at the desired fixed level, until the washing mixture is heated by the heater 11 to reach the azeotropic point thereof. As previously mentioned, this azeotropic point is 61.6° C., which is lower than the azeotropic point (79.5° C.) of the binary azeotropic mixture of isopropyl alcohol-water system used in the previous example by about 18° C. The use of this ternary azeotropic mixture thus enables the washing and drying operation at a lower temperature than when using the above described binary azeotropic mixture. The remaining operations in the sequence of this example are substantially the same as those of the previous example using the binary system azeotropic mixture, and will not be described in detail for the sake of simplicity.

The settings of this example as described above may be suitably used for the water-removing and drying operation in the case that the master mask 4, or the article to be cleaned, has poor heat resistance. On the other hand, in the case that the article to be cleaned has good heat resistance, other settings for the component ratio may be used to perform the washing and drying operation at other temperatures, like the previous example using the binary system azeotropic mixture.

Figure 3:
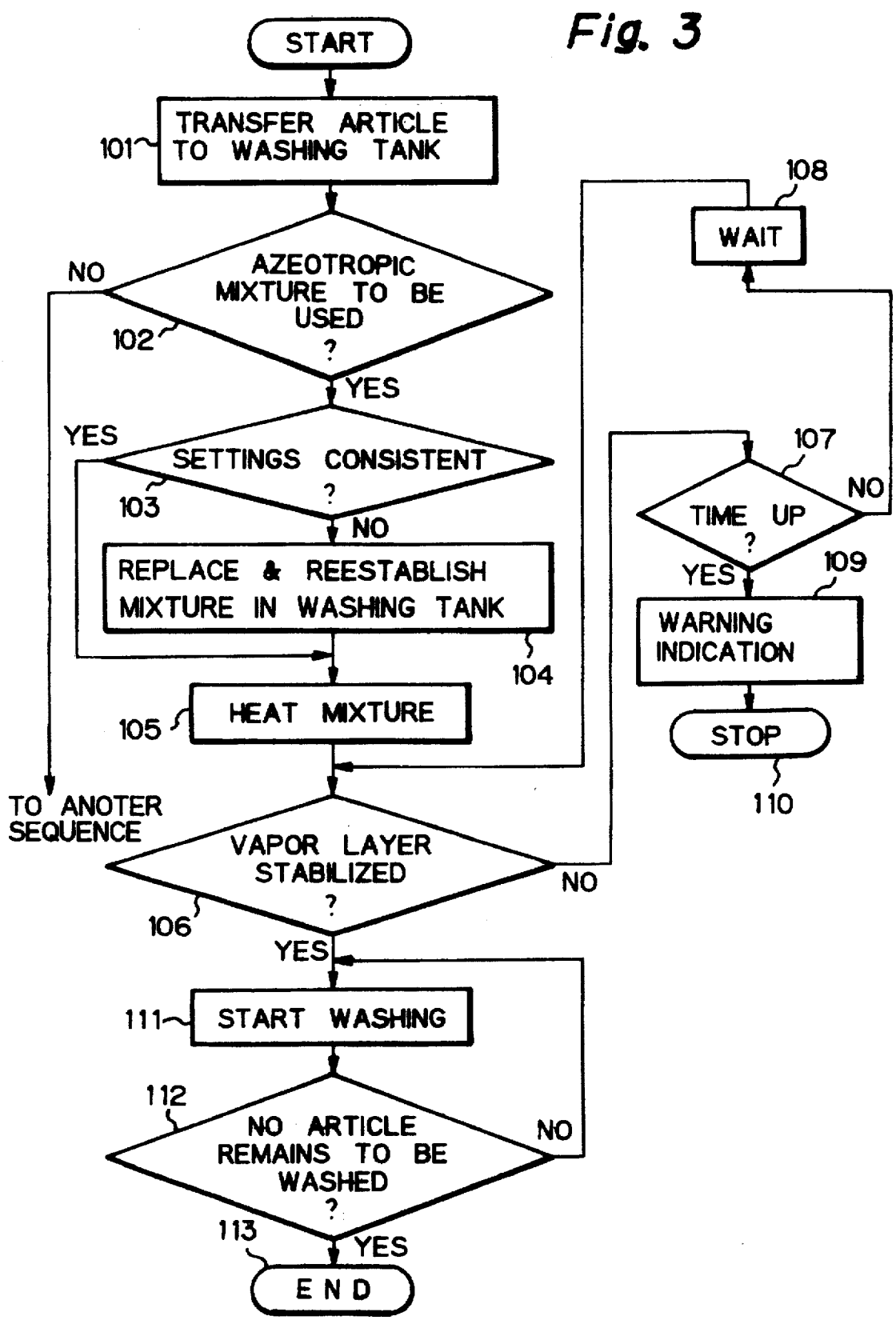
FIG. 3 is a flow chart showing an exemplified cleaning operation sequence which may be carried out by the apparatus of FIG. 1.
Figure 4:
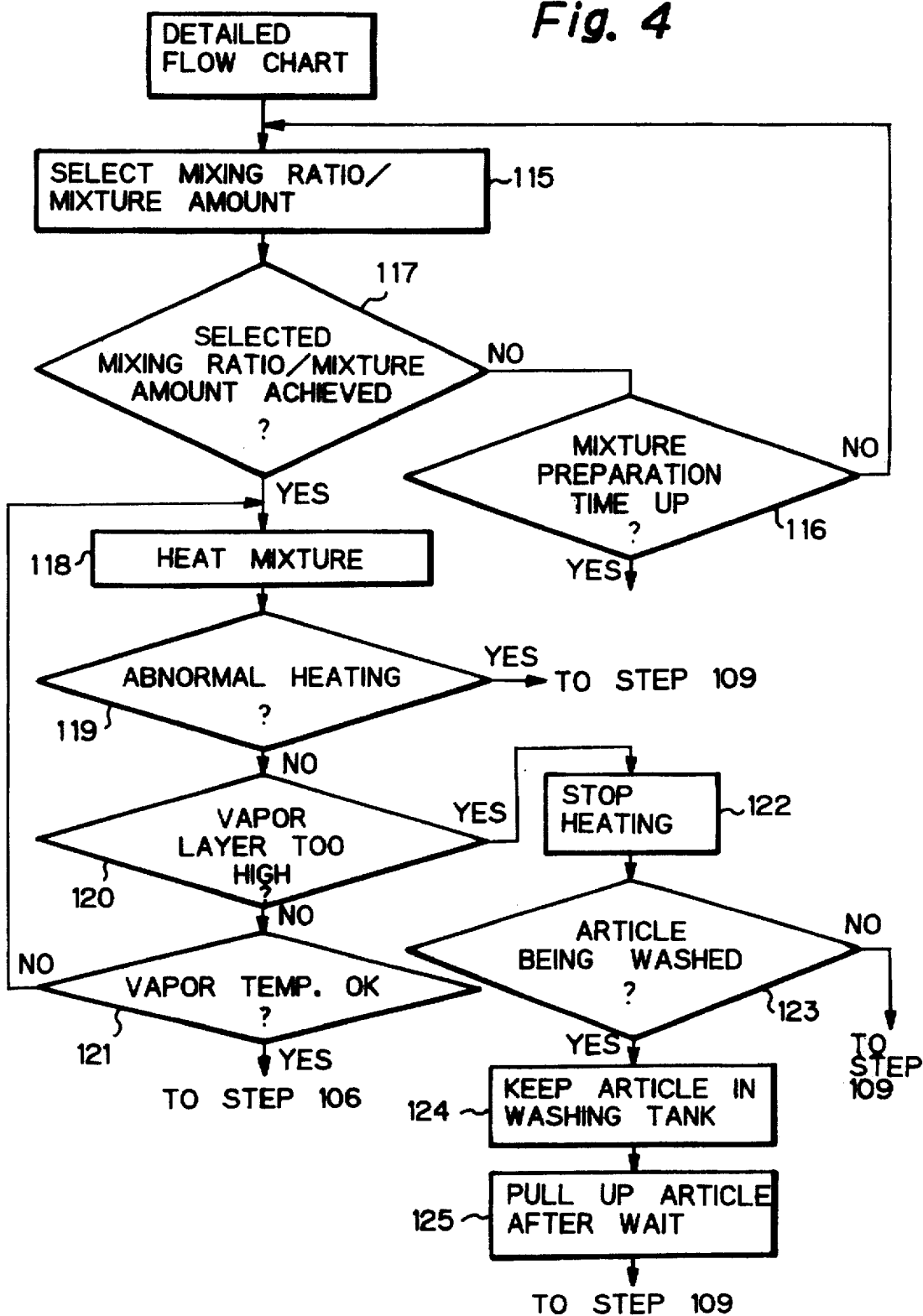
FIG. 4 is a flow chart showing a part of the operation sequence of FIG. 3 in more detail.

Referring next to FIGS. 1, 3 and 4, a more detailed example of operation sequence, in an actual process, of the washing and drying apparatus according to the embodiment of FIG. 1 will be described. In this example, it is assumed that the washing tank 2 contains an amount of washing mixture 1 used in the preceding operation.

FIG. 3 shows a flow chart illustrating the operation sequence of the washing and drying apparatus of FIG. 1 and FIG. 4 shows a flow chart illustrating a part of the operation sequence of FIG. 3 flow chart in more detail. In FIG. 3, the operation sequence starts with step 101 where master mask 4 is transferred by the master mask transfer unit 31 toward the washing tank 2. Then, in step 102, it is determined whether the apparatus has been set such that the master mask 4, which is the article to be cleaned, is to be water-removed and dried using an azeotropic mixture or alternatively using no azeotropic mixture but a conventional single liquid such as isopropyl alcohol. In the latter case, the following operation sequence will be the same as a conventional one, which is not described in detail. If the apparatus is set to perform the water removing and drying operation using an azeotropic mixture and controlling the boiling point and the composition of the mixture, the process proceeds to step 103.

In step 103, the settings of the operation factors (for example, the boiling point, the ratio of the components, various process times, etc.) for the preceding operation and those for the current operation are compared with each other. If they are the same, then the sequence proceeds to step 105. Otherwise, the sequence proceeds to step 104, where the waste valve 12a of the washing tank 2 is opened to drain all the liquids out of the washing tank 2 if the combination of the components or the ratio of the components differs between the operations. Then, the conditions of the washing tank 2 are reestablished to be consistent with the current settings. More particularly, the combination of the components, the ratio of the components, the boiling points, the level of the liquid phase of the mixture, the time period for the water-removing, etc. are reselected and the necessary amounts of the components of the azeotropic mixture are supplied from the reservoir tanks 15a and 15b (or from the reservoir tanks 15a–15c) into the washing tank 2 according to the reselected values.

Next, in step 105, the washing mixture 1 is heated by the heater 11 to a desired temperature while being stirred by the stirrer unit 36 to maintain its uniformity. During the heating, the measurements from the vapor temperature sensors 6b and 6c are monitored to detect when these measurements have been stabilized to represent the temperature of the azeotropic point.

Next, in step 106, it is determined based on the measurements from the vapor temperature sensors 6b and 6c and the liquid temperature sensor 10a whether the condition of the vapor phase washing mixture in the vapor layer 1a has been stabilized. If so, the sequence proceeds to step 111, where the master mask 4, which is the article to be cleaned, is transferred by the master mask transfer unit 31 to the predetermined position in the washing tank 2, and the washing operation is started.

The master mask 4 is exposed to (or immersed in) the vapor phase mixture forming the vapor layer 1a, during which any dust particulates and grease films adhered on the surface of the master mask 4 are removed therefrom by the dissolution effect of the washing agents contained the vapor phase of mixture in the vapor layer 1a. Further, any water adhering to the surface of the master mask 4 is washed away by the condensate generated from the vapor layer 1a so that water-removing may be achieved. After having exposed to the vapor layer 1a for a predetermined time, the master mask 4 is transferred out of the washing tank 2 by means of the master mask transfer unit 31. The condensate generated from the vapor layer 1a and wetting the surface of the master mask 4 has a high drying rate so that it quickly vanishes out by evaporation during the time period the master mask 4 are being transferred out of the washing tank 2.

All of the washed master masks 4 are transferred to a dust detection section (not shown), where they undergo an inspection with respect to the cleanliness and the dryness of their surfaces. When a master mask has been rejected by the dust detection section, it should be considered why it has been rejected. In particular, if a large proportion of the inspected master masks have been rejected, the operation sequence returns to step 104 so as to reselect the washing and drying operation conditions. On the other hand, if only a small proportion of the inspected master masks are rejected, the operation is continued without any alterations to the washing and drying conditions until a predetermined number of master masks 4 forming one lot have been washed and dried, and then the washing and drying conditions are reselected and those of the master masks 4 in that lot which have been rejected in the inspection are washed and dried again.

The washing and drying operation in step 111 is continued until it is determined in step 112 that no master mask 4 remains to be cleaned, when the sequence proceeds to step 113 to end the operation.

Referring back to step 106, if it is determined in step 106 that the vapor layer 1a is not stabilized yet, the sequence proceeds to step 107, where the actual heating time from the start of heating is compared with the preselected limit for the heating time. If the actual heating time has not exceeded the limit, then the sequence waits a pre-determined time in step 108 and return to step 106 again so as to continually monitor the vapor condition until it is stabilized. In the case the actual heating time has exceeded the preselected limit before the vapor condition is stabilized, sequence proceeds to step 109 to provide a warning indication, and then to step 110 to power off the heater 11 so as to stop the heating sequence.

Referring next to the flow chart of FIG. 4, that part of the operation sequence of FIG. 3 which corresponds to steps 103 to 105 is described in more detail.

The operation sequence of the flow chart of FIG. 4 start with step 115 where the operator selects the combination of the components of the azeotropic mixture to be used, the temperature of the azeotropic point, the ratio of the components in the azeotropic mixture, the exposure time of the master mask to the vapor phase mixture, etc.

For example, it is assumed here that the azeotropic mixture to be used comprises a ternary system consisting of water, isopropyl alcohol and isopropyl ether, and that the water-removing and drying by vapor is performed at the azeotropic point of 61.6° C. Thus, the operation factors corresponding to these conditions are entered in step 115. Next, in step 117, the apparatus is automatically set by the central control system (not shown) to prepare a desired amount of washing mixture having a component ratio (% by weight) water:isopropyl alcohol:isopropyl ether=4.7:7.3:88, and the opening/closing operations of the supply valves 13a–13c of the washing tank 2 is controlled based on the information obtained from the mixture component concentration sensors 9a–9c and from the liquid level sensors 8a–8d, so that appropriate amounts of isopropyl alcohol, ultrapure water and isopropyl ether may be supplied from the reservoir tanks 15a–15c, respectively, into washing tank 2 and mixed there.

In step 117, the preparation (mixing) time of the mixture is continuously monitored by a timer, and in the case that the preparation (mixing) time has exceeded a predetermined maximum time allowed for the preparation of the washing mixture before the desired washing mixture is prepared, the operation sequence proceeds to step 116 where it is determined that a time-up has occurred, and then to step 109 where a warning indication is provided to the operator and current status information of the apparatus is supplied to the central control system.

When the desired washing mixture 1 is prepared in step 117, then in step 118, the washing mixture 1 is heated by the heater 11 to the azeotropic point of the ternary system washing mixture 1 of 61.6° C. This heating process is continuously monitored by the liquid temperature sensor 10a and the heater temperature sensor 10b. In the case that an aberrant heating such as bumping has occurred or an extraordinary temperature has occurred due to a burn out of the heater line or other failure, it is determined in step 119 whether the heating process is considered abnormal. If so, the operation sequence proceeds to step 109 where a warning indication is provided to the operator and current status information of the apparatus is supplied to the central control system.

Similarly, the temperature of the vapor phase mixture in the vapor layer 1a, which is generated by the heating of the liquid phase mixture in the liquid layer 1b, is continuously monitored by the vapor temperature sensors 6a–6c so as to prevent the overflow of the vapor phase mixture. In the case that the level of the gas-gas interface 22 between the vapor layer 1a and the air layer is too high, it is determined in step 120 that the level of the vapor layer is too high, and the operation sequence automatically proceeds to step 122 to power off the heater 11 to stop heating.

At the point of time when the operation sequence has reached step 122, the washing operation of the master masks 4 is not started yet, and thus the operation sequence further proceeds from step 123 to step 109 of FIG. 3, where a warning indication is provided to the operator and current status information of the apparatus is supplied to the central control system. However, in step 123 following step 122, if a master mask in the preceding lot is erroneously being washed in the vapor phase mixture in the vapor layer 1a, then that master mask is kept in the vapor phase mixture in the washing tank 2 for a predetermined time period in step 124, before it is pulled up and taken out of the washing tank 2 in step 125. In this manner, inappropriate water-removing and drying operation is avoided and the operation sequence proceeds to step 109.

On the other hand, if the level of the gas-gas interface 22 is below the predetermined upper limit, then the operation sequence proceeds to step 121, where it is determined whether the temperature of the vapor phase mixture 1a has entered in the selected temperature range. If not, the operation sequence returns to step 118 to continue the heating process. If the temperature of the vapor phase mixture 1a has entered in that range, the operation sequence proceeds to step 106 of FIG. 3.

As described, in this example, the article to be cleaned, i.e., the master mask 4, is washed, water-removed and dried by immersing the article in the vapor phase washing mixture forming the vapor layer 1a. Alternatively, the washing, water-removing and drying may be achieved by immersing the article in the liquid phase washing mixture forming the liquid layer 1b.

It is apparent from the foregoing description that the washing and drying method of the embodiment just described, unlike the water-removing and drying technique using warm ultrapure water alone, requires no tight control of the temperature of the washing liquid or that of the pull rate for pulling up the washed article, and prevents any electrostatical recontamination of the washed article due to its zeta-potential as well as any trace of water mark left on the surface of the dried article.

Further, warm ultrapure water has no capability of dissolving grease films and organic dust particulates unlike any of CFCs, alcoholic organic solvents and CFC-substitute solvents. Thus, any organic dust particulates left on the article surface even after the preceding cleaning step(s) can not be removed during the following water-removing and drying step using warm ultrapure water alone. In this regard, the method of the embodiment just described enables the selection of each of the component ratios of the vapor phase azeotropic mixture and the liquid phase azeotropic mixture both in the washing tank 2. Therefore, if considerable organic dust particulates are expected to be left on the article surface even after the preceding cleaning step(s) such as scrubbing step and ultrasonic washing step, such a washing mixture having an increased proportion of alcoholic or ketonic organic solvent may be used so as to enhance the removal of the residual organic dust particulates during the washing operation. On the other hand, if few organic dust particulates are expected to be left after the preceding cleaning step(s), a different washing mixture having reduced proportion of alcoholic or ketonic organic solvent may be used so as to suppress the consumption of such organic solvent, and reduce the resulting organic solvent waste so that a more environment-friendly process may be selected at low costs.

In the method of the embodiment just described, the washing and drying operation is carried out by using the washing mixture prepared by mixing a plurality of azeotropic component liquids, so that the method provides many advantages over the conventional methods in which an article to be cleaned is washed once using a single-component washing liquid, or washed a plurality of times using different single-component washing liquids. The advantages are as follows.

First, by using the method of this embodiment, we can select the component washing liquids for the mixture from those which are harmless to the global environment. Various CFC solvents have been conveniently used as the solvents for water-removing and drying operation so far, because of their excellent characteristics including high drying rate and are not dangerous in respect of fire and explosion; however, the use of CFC solvents are now being completely prohibited because they have been proven to destroy the ozone layer in the atmosphere protecting the earth from the harmful effect of the ultraviolet radiation. Recently, CFC-substitutes and other solvents including petroleum, alcoholic, ketonic and aromatic solvents are being tried as the replacements of CFCs; however, all of them are dangerous in respect of fire and explosion and the limitations relating to the human health. Therefore, those other chemicals which are free from the danger of fire are also being tried, but yet no satisfactory products in view of health and safety as well as acceptable drying ratio have been developed. Because no remarkable results appear to have been achieved despite the endeavors made during more than a decade by the world's scientists and manufacturers, it is not considered that any acceptable products satisfying all requisites including production costs can be developed in the near future.

The washing and drying method according to the embodiment just described above has been developed in order to at least partially relieve the limitations imposed on the conventional methods. By using the method of this embodiment, washing agents may be selected from those which are environment-friendly and relatively harmless to human health. In particular, the method of this embodiment uses water as one of the components of the azeotropic washing mixture, resulting in the presence of water in each of the liquid phase azeotropic mixture and the vapor phase azeotropic mixture, so that the danger of fire and explosion is significantly reduced leading to a safer operation.

The azeotropic point of the azeotropic mixture is lower than any of the boiling points of the component liquids of the mixture. This is advantageous when it is desired to perform the washing operation at a relatively low temperature, for example, when the material of the article to be cleaned has poor heat resistance.

In the apparatus for washing and drying an article of the embodiment shown in FIG. 1, an azeotropic mixture is used as the washing mixture, there are provided reservoir tanks 15a–15c the numbers of which corresponds to the numbers of the components constituting the azeotropic mixture, and fine control of the concentrations of the components is conducted using the mixture component concentration sensors 9a–9c and the boiling point of the azeotropic mixture is monitored by the liquid temperature sensor 10a and the heater temperature sensor 10b. In this manner, the drying condition of the master mask 4, or the article to be cleaned, can be optimized. In particular, where water is used as one of the component liquids of the azeotropic mixture, there may be provided such an apparatus which requires no costly safe measures such as an intrinsically safe structure, and thus can be constructed at a reduced cost, and provide high performance as well.

In the apparatus of thus embodiment, the master mask 4, or the article to be cleaned, is washed by immersing it in the vapor phase mixture forming the vapor layer 1a, and any dust particulates adhering to the surface of the master mask 4 are washed off thereby and removed out of the washing tank 2 through the condensate pan 5, so that the washing mixture 1 is kept free from contamination by dust and is kept clean.

Figure 5:
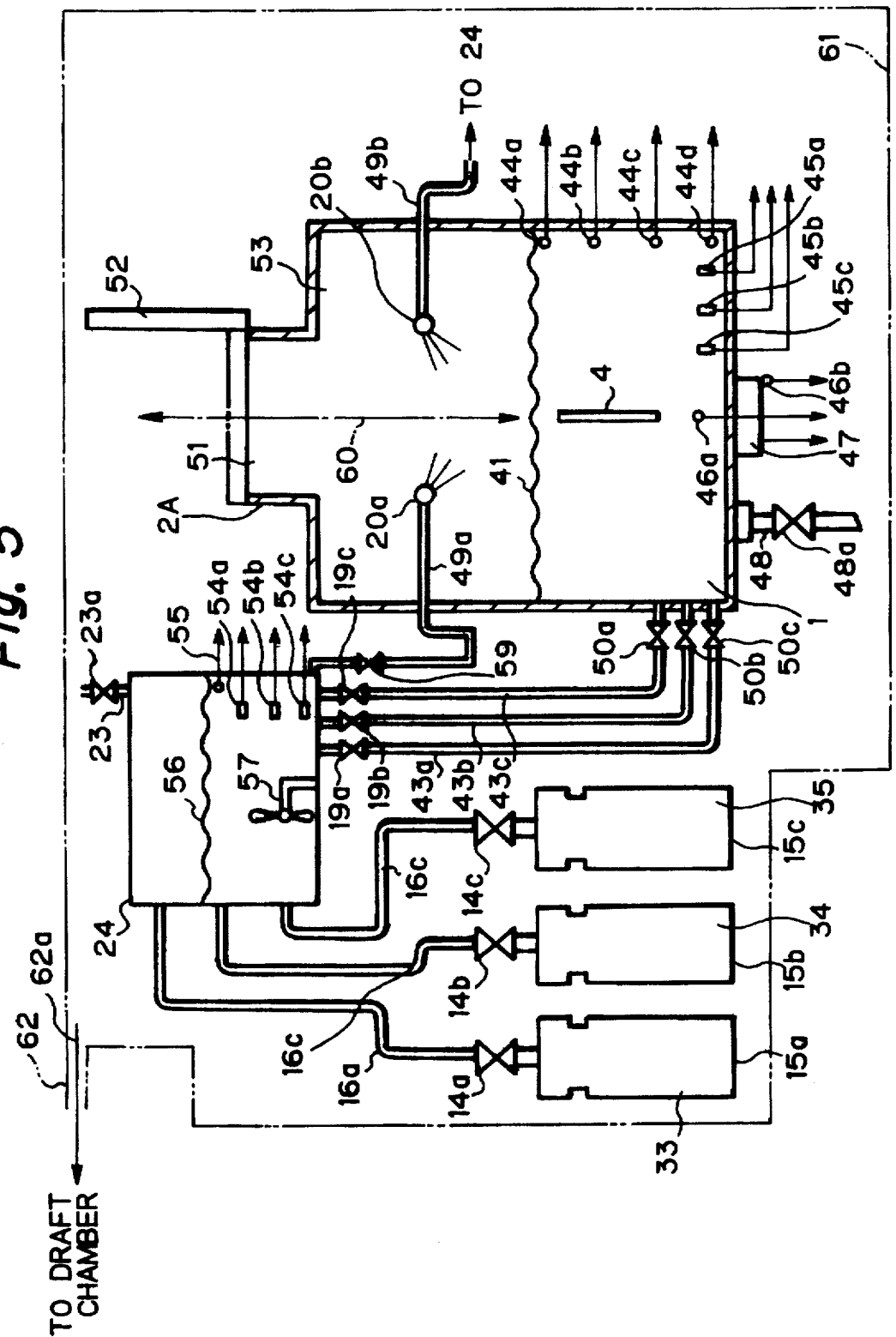
FIG. 5 is a schematic illustration of another embodiment of the apparatus for washing and drying an article according to the present invention in a partially sectional view.

Referring next to FIG. 5, another embodiment according to the present invention will be described. In the embodiment of FIG. 1 previously described, the master mask 4, which is the article to be cleaned, is washed in the vapor phase mixture forming the vapor layer 1a. In contrast, in the embodiment now being described, a master mask 4, or an article to be cleaned, is immersed in the liquid phase mixture 1 for washing, and then pulled up out of the liquid phase mixture 1 at very low pull rate so that the interfacial surface tension acting on the liquid surface 41 of the liquid layer 1b of the mixture may remove excessive liquids from the surface of the master mask 4 for drying. In this embodiment, a mixing tank 24 is provided between the reservoir tanks 15a–15c and the washing tank 2A, so that the uniformity of the mixture 1 to be used in the washing tank 2A may be attained without stirring the mixture in the washing tank 2A. The remaining portions of the embodiment of FIG. 5 have the same arrangements and constructions as those of the embodiment of FIG. 1. Thus, corresponding parts and elements in FIG. 5 are designated by the same reference numerals as in FIG. 1 and will not be described in detail for the sake of simplicity.

FIG. 5 shows a schematic illustrating the washing and drying apparatus according to the embodiment now being described. As shown, an amount of washing mixture 1 is charged in the washing tank 2A. There is a space 53 in the washing tank 2A above the liquid surface 41 of the liquid phase washing mixture 1, which is filled with gaseous mixture comprising the vapor phase washing mixture and air. Air enters the washing tank 2A when a hermetical door 52 provided at the top opening 51 of the washing tank 2A is opened to put a master mask 4 into the washing tank 2A. The washing masks 4, which constitute the articles to be water-removed and dried, are transferred by means of a master mask transfer unit (not shown) along a transfer path represented by a dot-and-dash line with arrow heads 60 into the washing tank 2, to a position under the liquid surface 41 of the liquid phase mixture 1, and then the water-removing and drying operation is performed. FIG. 5 shows the master mask 4 positioned at the washing position.

There are provided a pair of shower pipes 49a and 49b extending through the opposite side walls of the washing tank 2A and disposed at a height above the liquid surface 41 of the washing mixture 1 and below the top opening 51 of the washing tank 2A. The shower pipes 49a and 49b terminate with respective rinsing shower nozzles 20a and 20b, from which washing mixture is showered onto the surface of the master mask 4.

The shower pipes 49a and 49b have the other ends thereof communicating with the mixing tank 24, the mixture in which is used as the rinsing shower liquid. There are disposed in the shower pipes 49a and 49b respective pumps (not shown) for supplying rinsing shower liquid. The rinsing shower liquid is supplied from the mixing tank 24 to the rinsing shower nozzles 20a and 20b upon activation of the pumps. The shower pipes 49a and 49b are provided with respective valves for controlling supplies of the rinsing shower liquid through the associated shower pipes. FIG. 5 shows only one of the valves, the valve 59 associated with the shower pipe 49a.

As with the embodiment of FIG. 1, there are also provided on the bottom wall of the washing tank 2A a heater 47 for heating the washing mixture 1, a liquid temperature sensor 46a for measuring the temperature of the washing mixture 1, a heater sensor 46b for measuring the temperature of the heating surface of the heater 47, mixture component concentration sensors 45a–45c for determining the concentrations of the component washing liquids in the washing mixture 1 and a drain pipe 48 with a drain valve 48a for disposing/collecting the used washing mixture 1. The purpose and operation of these elements are the same as those of the corresponding elements in the embodiment of FIG. 1, and thus will not be described in detail.

The mixing tank 24, which is connected between the reservoir tanks 15a–15c and the washing tank 2A, receives a first component liquid 33, a second component liquid 34 and a third component liquid 35 from the reservoir tanks 15a–15c through the supply pipes 16a–16c, respectively, by means of transfer pumps (not shown) disposed along the supply pipes 16a–16c, respectively. The transfer pumps may be replaced by any suitable transfer means such as compressed air based transfer units. The component liquids supplied into the mixing tank 24 are stirred by a stirrer unit 57 mounted on the bottom wall of the mixing tank 24 into a uniform mixture. The level of the liquid surface 56 of the mixture is determined by means of a liquid level sensor 55, and is maintained at a constant level by controlling the opening/closing operations of supply valves 14a–14c associated with the reservoir tanks 15a–15c based on the results obtained from the liquid level sensor 55.

There are disposed in the mixing tank 24 and immersed in the mixture component concentration sensors 54a–54c for determining the concentrations of the component liquids in the mixture, whose determination results are supplied to a central control system (not shown). Initially, the amounts of the component liquids to be supplied into the mixing tank 24 are controlled by means of the supply valves 14a–14c according to the instructions entered into the central control system; however, fine control of the supplies of the components is performed, based on the determination results obtained from the mixture component concentration sensors 54a–54c, by the opening/closing operations of the supply valves 14a–14c.

The mixing tank 24 is provided with a vent pipe 23 at the top thereof for venting gas and vapor from the mixing tank 24. A vent valve 23a provided at the inner end of the vent pipe 23 is normally closed and opened upon transfer of the components from the reservoir tanks 15a–15c to the mixing tank 24 so that the gas and vapors in the mixing tank 24 may be emitted therefrom. In the case compressed air based transfer units are used in place of the transfer pumps as the component liquid transfer means, the vent valve 23a is closed upon the transfer of the components, opposite to the above case, so that precise amounts of component liquids may be transferred into the mixing tank 24.

The mixing tank 24 communicates with the washing tank 2A through supply pipes 43a–43c and a desired amount of uniformly mixed mixture may be transferred from the mixing tank 24 into the washing tank 2A by actuation of transfer pumps (not shown). The supply pipes 43a–43c are provided with respective main valves 19a–19c near their ends adjacent to the mixing tank 24. The mixture prepared in the mixing tank 24 may be transferred into the washing tank 2A by opening one of the main valves 19a–19c. The supply pipes 43a–43c are provided with respective supply valves 50a–50c near their ends adjacent to the associated inlets to the washing tank 2A. Although the apparatus of the embodiment shown in FIG. 5 has three lines of supply pipes from the mixing tank 24 to the washing tank 2A, only one line of supply pipe may be sufficient for the purpose of the present invention.

The washing tank 2A, the mixing tank 24 and the reservoir tanks 15a–15c are confined within a housing 61 schematically shown by the box of imaginary lines in FIG. 5, in order to prevent the vapors involved in the washing and drying operation and which have escaped out of the tanks 2A, 24 and 15a–15c from dispersing into the atmosphere. The housing 61 is provided with a draft port 62a for collecting the escaped vapors. The escaped vapors in the housing 61 are drawn through a draft pipe 62 connected with the draft port 62a into a draft chamber (not shown) and are collected there.

An exemplified washing and drying operation carried out in the washing tank 2A of the apparatus according to the embodiment of FIG. 5 will now be described in detail. In this example, as with the previously described example, the washing mixture to be used is a binary system azeotropic mixture consisting of isopropyl alcohol and ultrapure water.

In FIG. 5, the master mask 4 is transferred by means of the master mask transfer unit (not shown) along the transfer path represented by the dot-and-dash line with arrow heads 60 into a position below the liquid surface 41 so that the entire of the master mask 4 may be immersed in the liquid phase mixture 1. When the master mask 4 is transferred passing by the rinsing shower nozzles 20a and 20b, the rinsing shower liquid having contents substantially the same as that of the mixture 1 is showered onto the surface of the master mask 4, which removes some dust from the surface of the master mask 4. When the master mask 4 has been lowered under the liquid surface 41 and immersed in the mixture 1, the showering of the rinsing shower liquid is stopped.

At this point of time, the washing tank 2A has been charged with a desired amount of mixture 1, which was prepared in the mixing tank 24 to have a predetermined ratio of isopropyl alcohol and water mixed with each other, and the amount of the mixture 1 in the washing tank 2A has been heated by the heater 11 to a predetermined temperature (ranging from about 30° C. to 60° C.). The master mask 4, which has been lowered such that the entire of the master mask 4 is under the liquid surface 41, is then kept immersed in the liquid phase mixture for a predetermined time period (at least for the time required to allow the surface of the master mask 4 to reach a temperature nearly equal to that of the mixture 1), during which the surface of the master mask 4 is made cleaner.

In a conventional water-removing and drying apparatus in which an article is immersed in a single liquid of warm pure water and pulled up therefrom at a very low pull rate, the temperature of the warm pure water is typically st at 50°-80° C., or at temperatures lower than the boiling point of water (100° C.) by 20°-50° C., for operation. This avoids the water-removing and drying operation performed at the boiling point so as to prevent the seething of the liquid surface by boiling, which could otherwise spoil the intended effects of the water-removing and drying operation performed by the apparatus. This is also significant in preventing the recontamination of the dried surface of the article which may be caused by vapor generation through the boiling of the washing liquid. For the same reasons, the water-removing and drying operation of this embodiment is performed with a temperature of the mixture 1 lower than the azeotropic point of the isopropyl alcohol-water binary system (79.5° C.) by 30°-50° C.

The master mask 4, or the article to be cleaned, is pulled up out of the liquid surface 41 of the mixture 1 after the predetermined time period at a very low pull rate of, for example, about 2-10 mm/sec. as proposed in Japanese Laid-Open Patent NO. Hei 5-134397 (134397/1993). By pulling up the master mask 4 out of the liquid surface 41 at such a very low pull rate, the liquid adhering to the surface of the master mask 4 will be pulled down into the liquid phase mixture 1 by the effect of the surface tension acting on the liquid surface 41, so that the surface of the master mask 4 dries quickly. This principle is utilized here. Since this is done for the purpose of water-removing, it requires only the removal of water from the surface of the master mask 4, and thus any other components which have faster drying rates may remain on the surface of the master mask 4.

After being pulled up out of the liquid surface 41 of the mixture 1 at such a very low pull rate, the master mask 4 is then transferred upwardly at a faster, normal transfer rate. While the master mask 4 is transferred, the rinsing shower liquid may be showered onto the surface of the master mask 4 by the rinsing shower nozzles 20a and 20b if necessary, in order to remove any contaminant from the surface of the master mask 4, which may have been retransferred from the contaminated mixture 1 onto the surface of the master mask 4. Thereafter, the master mask 4 is transferred by the master mask transfer mechanism out of the washing tank 2. Since any residual mixture 1 left on and wetting the master mask 4 has a relatively high drying rate, it vanishes quickly through evaporation during the transfer of the master mask 4 out of the washing tank 2 by the master mask transfer unit. The remaining operations carried out in this example are the same as those performed in the exemplified operation sequence described above in connection with the embodiment of FIG. 1.

As apparent from the above, the apparatus of the embodiment of FIG. 5 uses an azeotropic mixture and exploits the drying effect provided by the surface tension acting on the liquid surface, so that the washing and drying process may be carried out at a temperature lower than any temperature possible with the embodiment of FIG. 1. According to a typical conventional method utilizing warm, pure water alone, the master mask 4, or article to be cleaned, must be kept in the washing tank until the temperature of the master mask 4 rises from the room temperature (about 20° C.) to a selected temperature of about 80° C. In contrast, according to the method of this embodiment, the temperature of the mixture 1 in the washing tank 2A may be selected to 30°-50° C., so that the temperature of the master mask 4 is only required to rise from room temperature (about 20° C.) to the selected 30° C., resulting in a higher total throughput (productivity) of the process.

In the above mentioned typical conventional method, the temperature difference between the master mask 4 and the washing liquid is as great as 30°-60° C., which requires a considerable residence time of the master mask 4 in the washing liquid, which in turn makes it difficult to improve the throughput. In contrast, in the method of this embodiment, the temperature difference between the master mask 4 and the washing liquid (i.e., the washing mixture 1) is as small as 10°-30° C., which requires a shorter residence time of the master mask 4 in the washing tank 2A resulting in a higher throughput.

The apparatus of the embodiment of FIG. 5 includes the rinsing shower nozzles 20a and 20b for showering the rinsing shower liquid onto the surface of the master mask 4; however, the shower nozzles 20a and 20b are not essential elements for the present invention and may be omitted. The mixing tank 24 may be provided with a heater similar to the heater 47 provided for the washing tank 2A, and a plurality of heater sources for the heaters may be provided.

Figure 6:
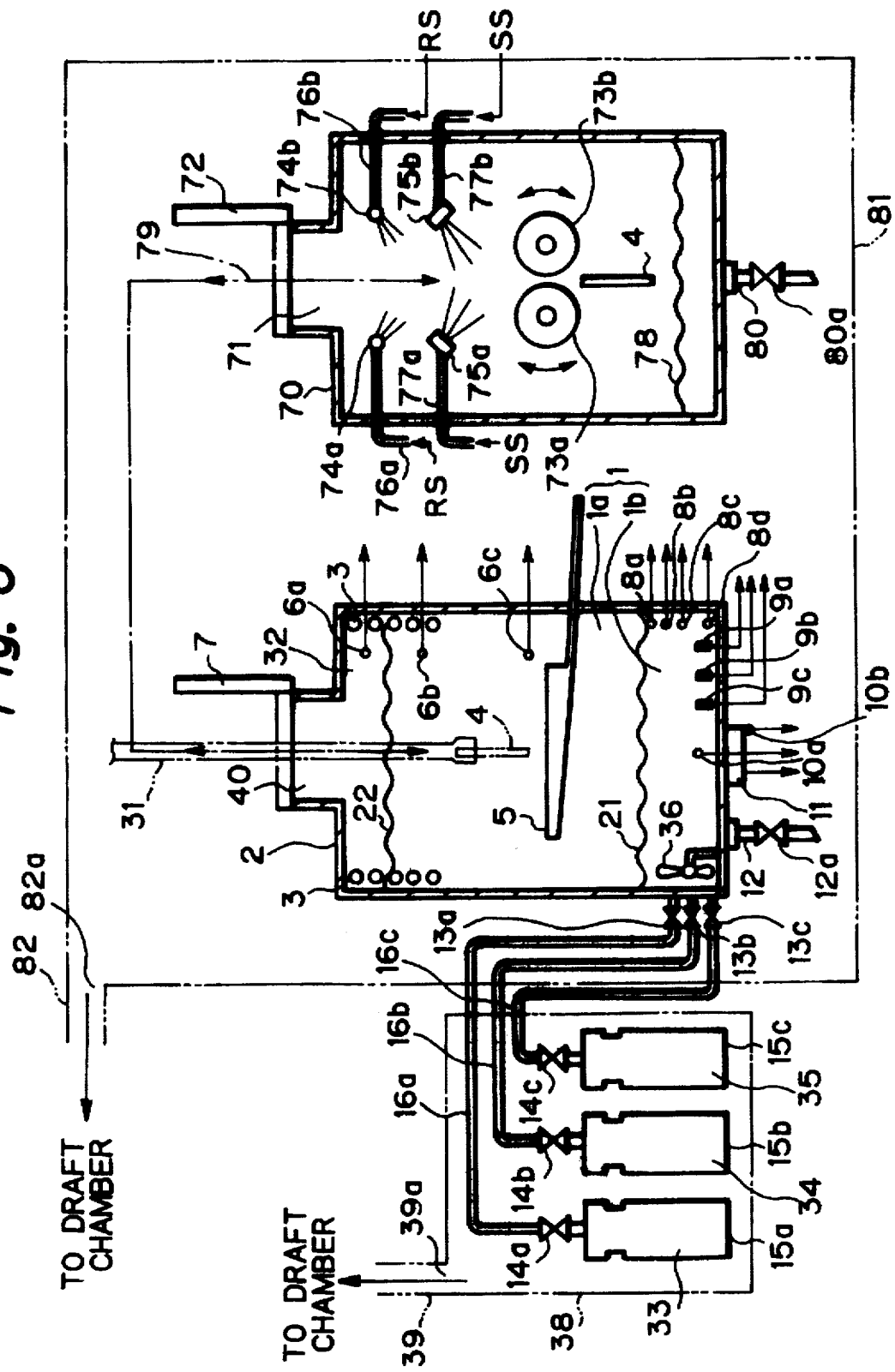
FIG. 6 is a schematic illustration of a further embodiment of the apparatus for washing and drying an article according to the present invention in a partially sectional view.

Referring next to FIG. 6, a washing and drying apparatus according to a further embodiment of the present invention will be described. The washing and drying apparatus of this embodiment is an integrated apparatus comprising the washing and drying apparatus of FIG. 1 and a scrubbing tank combined therewith. In FIG. 6, corresponding parts and elements are designated by the same reference numerals as in FIG. 1 and will not be described in detail.

FIG. 6 shows a schematic illustrating the washing and drying apparatus of the embodiment now being described. The apparatus includes a scrubbing tank 70 which has a top opening 71 through which an article to be scrubbed is put in and taken out of the scrubbing tank 70. A master mask 4, which is an article to be scrubbed, is transferred by a master mask transfer unit 31 into the scrubbing tank 70 through the top opening 71, along a transfer path represented by dot-and-dash lines 79, and scrubbed in the scrubbing tank 70. The top opening 71 is provided with a hermetical door 72, which is normally closed except for when the master mask 4 is transferred passing through the top opening 71.

There are provided in the scrubbing tank 70 rinsing shower nozzles 74a and 74b at positions near the top opening 71, ultrasonic shower nozzles 75a and 75b at lower positions and scrubbing brushes 73a and 73b at much lower positions. The rinsing shower nozzles 74a and 74b are connected with pipes 76a and 76b, respectively, extending through opposite side walls of the scrubbing tank 70. The pipes 76a and 76b supply rinsing liquid to the rinsing shower nozzles 74a and 74b, which shower the rinsing liquid onto the master mask 4. The rinsing liquid is supplied from a rinsing liquid supply RS (not shown).

Similarly, the ultrasonic shower nozzles 75a and 75b are connected with pipes 77a and 77b, respectively, extending through the opposite side walls of the scrubbing tank 70. The pipes 77a and 77b supply showering liquid to the ultrasonic shower nozzles 75a and 75b, which shower the showering liquid onto the master mask 4 while injecting ultrasonic energy into the shower liquid. The showering liquid is supplied from a shower liquid supply SS (not shown).

The rinsing liquid showered by the rinsing shower nozzles 74a and 74b and the showering liquid showered by the ultrasonic shower nozzles 75a and 75b may be any appropriate washing agents selected from the group consisting of ultra-pure water and various solvents. Alternatively, these liquids may be a mixture having the same composition as the washing mixture 1 used in the washing tank 2. In such case, a mixing tank similar to the mixing tank 24 of FIG. 5 may be used to supply the mixture for use as the rinsing liquid and the showering liquid, for which the pipes 76a, 76b, 77a and 77b may be connected with such mixing tank.

The scrubbing brushes 73a and 73b are disposed near the center region in the scrubbing tank 70 and positioned to allow the master mask 4 to pass through between the scrubbing brushes 73a and 73b. The scrubbing brushes 73a and 73b can be rotated in both direction by means of driving system (not shown), and the master mask 4 undergoes vertical reciprocal motion between the scrubbing brushes 73a and 73b while the brushes are rotated, and brushed thereby. During the brushing by the scrubbing brushes 73a and 73b, the ultrasonic shower nozzles 75a and 75b shower the showering liquid onto the surface of the master mask 4.

The used rinsing liquid and the showering liquid form the waste liquid gathered at the bottom of the scrubbing tank 70. The level of the liquid surface 78 of the waste liquid is detected by a liquid level sensor (not shown), and the waste liquid is drained out of the scrubbing tank 70 through a drain pipe 80 and collected. The drain pipe 80 is provided with a drain valve 80a at the end thereof adjacent the scrubbing tank 70, and the level of the liquid surface 78 of the waste liquid is adjusted by the opening/closing operations of the waste valve 80a. There is provided a washing tank 2 having the same arrangement and construction as the washing tank 2 used in the embodiment of FIG. 1, which is disposed in juxtaposition with the scrubbing tank 70.

The washing tank 2 and the scrubbing tank 70 are confined within a housing 81 schematically shown by the box of imaginary lines in FIG. 6, in order to prevent the vapors involved in the washing and drying operation from escaping out of the tanks 2 and 70 and dispersing into the atmosphere. The housing 81 is provided with a draft port 82a for collecting the escaped vapor. The escaped vapors in the housing 81 are drawn through a draft pipe 82 connected with the draft port 82a into a draft chamber (not shown) and are collected there. Also, as with the embodiment of FIG. 1, the reservoir tanks 15a–15c are confined within another housing 38 schematically shown by the box of imaginary lines in FIG. 6, in order to prevent the vapors of the washing liquids from escaping out of the tanks 15a–15c and dispersing into the atmosphere. The escaped vapors in the housing 38 are drawn through a draft pipe 39 connected with a draft port 39a into a draft chamber (not shown) and are collected there.

Next, an exemplified washing and drying operation carried out by the washing and drying apparatus of the embodiment of FIG. 6 will be described.

The hermetical door 72 at the top of the scrubbing tank 70 is opened, and the master mask 4, which is the article to be cleaned, is transferred by the master mask transfer unit 31 along the transfer path represented by the dot-and-dash lines 79 into the scrubbing tank 70. When the master mask 4 has been moved in the scrubbing tank 70, the scrubbing operation is started.

When the master mask 4 reaches the position adjacent the rinsing shower nozzles 74a and 74b, rinsing liquid is showered onto the master mask 4 by the rinsing shower nozzles 74a and 74b. After the surface of the master mask are well wetted by the rinsing liquid, the showering liquid with ultrasonic energy injected is showered onto the master mask 4 by the ultrasonic shower nozzles 75a and 75b. The master mask 4, well wetted by the showering liquid, is then brushed by the scrubbing brushes 73a and 73b so that the contaminants on the surface of the master mask 4 are eliminated while the ultrasonic showering liquid continues to be showered onto the master mask 4.

The rinsing liquid for the rinsing shower nozzles 74a and 74b and the showering liquid for the ultrasonic shower nozzles 75a and 75b to be used here, may be selected depending on the contamination level of the surface of the master mask 4 and the properties of the contaminants. For example, if the contamination level is relatively low and the contaminants are easily removable by using water, the rinsing liquid and the showering liquid may be ultrapure water. On the other hand, if the surface of the master mask 4 is severely contaminated and the contaminants are difficult to remove by using water, appropriate washing agents may be selected for such liquids from the group consisting of alcohols, ethers, ketones and various azeotropic mixtures described above.

The master mask 4, having been scrubbed, is again rinsed well by the rinsing shower nozzles 74a and 74b, and transferred by the master mask transfer unit 31 along the transfer path represented by the dot-and-dash lines 79 and out of the scrubbing tank 70. When the master mask 4 is transferred out of the scrubbing tank 70, the hermetical door 72 is closed.

The master mask 4, having been transferred out of the scrubbing tank 70, is further transferred by the master mask transfer unit 31 to a position just above the washing tank 2, and then undergo a washing and drying operation using the vapor of an azeotropic mixture, like the embodiment of FIG. 1. This process is substantially the same operation as the exemplified washing and drying operation described above with respect to the embodiment of FIG. 1.

By using the washing and drying apparatus of the embodiment of FIG. 6, any contaminants, which could be otherwise difficult to remove during the washing operation using the azeotropic mixture 1 carried out in the washing tank 2, can be removed during the scrubbing operation carried out in the scrubbing tank 70 as the pretreatment for the washing operation. This basically improves the cleanliness of the master mask 4, as well as enables the selection of the components for the azeotropic mixture 1 to be used in the washing tank 2 from the washing agents which are more desirable in view of the disaster prevention and the harmlessness to the human health. Further, this reduces the contamination of the mixture 1 in the washing tank 2 which could be otherwise caused by the contaminants initially adhering to the surface of the master mask 4, and maintains cleanness of the mixture 1 resulting in a longer life of the mixture 1.

Figure 7:
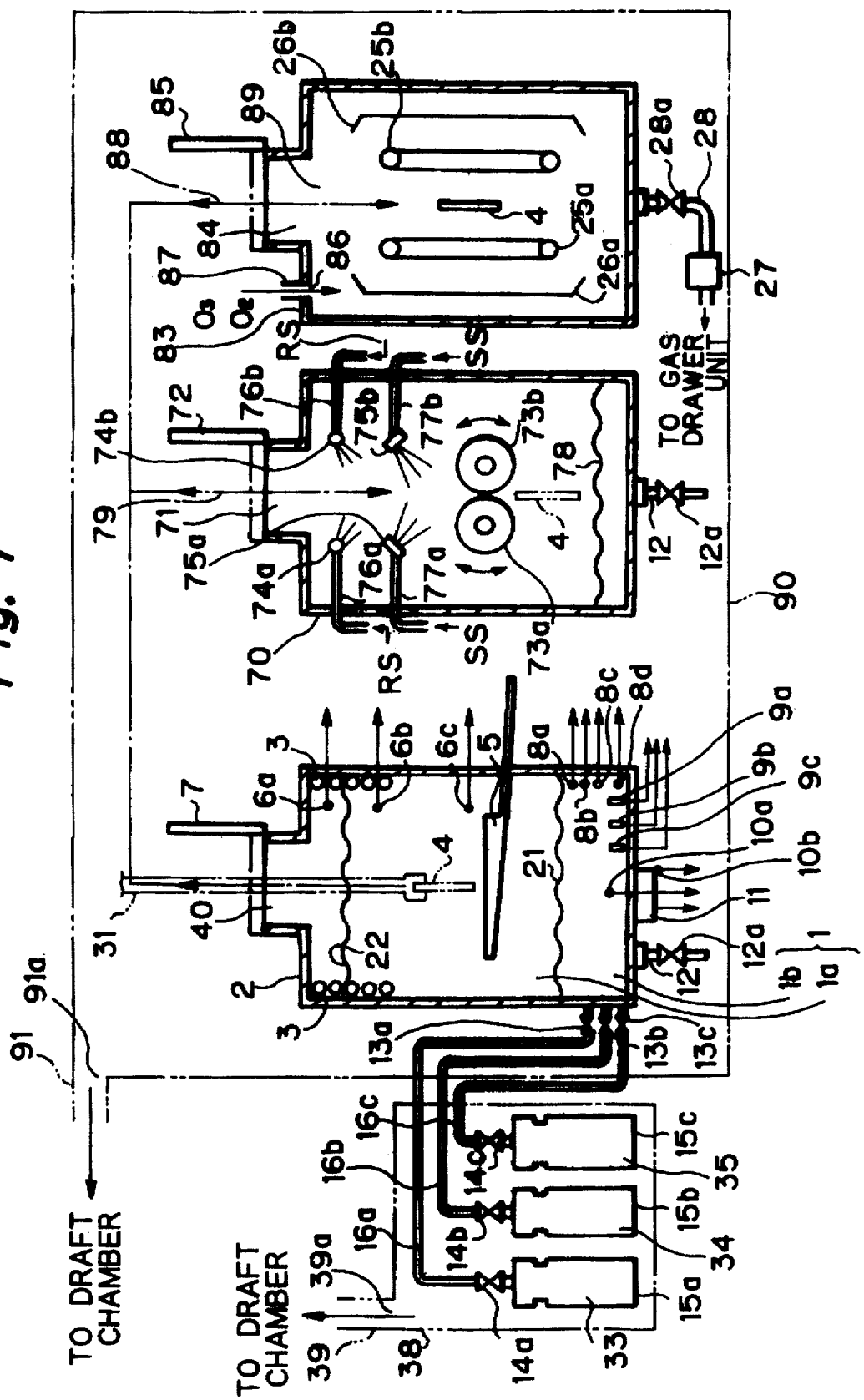
FIG. 7 is a schematic illustration of yet another embodiment of the apparatus for washing and drying an article according to the present invention in a partially sectional view.

Referring next to FIG. 7, a washing and drying apparatus according to yet another embodiment of the present invention will be described. The apparatus of this embodiment includes as a part thereof the washing and drying apparatus of FIG. 6 together with a hydrophilicity enhancing tank combined therewith. The hydrophilicity enhancing tank is used to enhance the hydrophilicity of the surface of the master mask 4, or the article to be cleaned, by irradiating ultraviolet rays onto the surface of the master mask 4. In FIG. 7, corresponding parts and elements are designated by the same reference numerals as in FIG. 6 and will not be described in detail for simplicity.

FIG. 7 shows a schematic illustrating the washing and drying apparatus of the embodiment now being described, in which the hydrophilicity enhancing tank 83 has a top opening 84 through which the master mask 4, which is the article to be cleaned, is put in and taken out of the hydrophilicity enhancing tank 83. The master mask 4 is transferred by a transfer unit (not shown) along the transfer path 88 represented by dot-and-dash lines 88 through the top opening 84 into the hydrophilicity enhancing tank 83, where the master mask 4 undergoes the operation for enhancing the hydrophilicity of the surface. FIG. 7 shows the master mask 4 located at an irradiation position for the ultraviolet ray irradiation. When the hydrophilicity enhancing operation is carried out, a hermetical door 85 for closing the top opening 84 is opened and closed.

There are disposed in the hydrophilicity enhancing tank 83, substantially at the midmost height between the top and the bottom of the tank 83, ultraviolet lamps 25a and 25b which are elongated in shape and extend vertically along the opposite side walls of the tank 83, such that both sides of the master mask 4 may be irradiated by ultraviolet rays from both direction simultaneously. There are provided reflectors 26a and 26b associated with the ultraviolet lamps 25a and 25b, respectively. Each reflector is disposed on the back side of the associated ultraviolet lamp and covering that side. Ultraviolet rays emitted from the ultraviolet lamps 25a and 25b directly irradiate the master mask 4, or are reflected by the reflectors 26a and 26b so as to indirectly irradiate it.

The hydrophilicity enhancing tank 83 has at the top wall thereof a second opening 86 through which oxygen ($O_2$) or ozone ($O_3$) gas is introduced in the tank 83 in order to expedite the hydrophilicity enhancing operation. Oxygen or ozone gas is supplied from a gas cylinder (not shown) through a nozzle 87 communicating with the opening 86.

The hydrophilicity enhancing tank 83 has a draft pipe 28 for drawing out of the tank 83 contaminant gasses including $CO$, $CO_2$, $H_2O$, etc. which may be produced by the reactions of either atomic oxygen or ozone and various organic compounds. The gasses in the hydrophilicity enhancing tank 83 are drawn out of the tank 83 by a gas drawer unit (not shown) through the draft pipe 28 when a draft valve 28a disposed along the draft pipe 28 is open. The draft pipe 28 is also provided with a catalytic converter 27 containing catalyst. The harmful gases drawn out of the hydrophilicity enhancing tank 83 will neutralized by the catalyst before directed to the gas drawer unit. There are provided a washing tank 2 and a scrubbing tank 70 having the same arrangements and constructions as the washing tank 2 and the scrubbing tank 70 used in the embodiment of FIG. 6, which are disposed in juxtaposition with the hydrophilicity enhancing tank 83.

The hydrophilicity enhancing tank 83, the washing tank 2 and the scrubbing tank 70 are confined within a housing 90 schematically shown by the box of imaginary lines in FIG. 7, in order to prevent the vapors and gasses involved in the washing and drying operation and escaped out of the tanks 83, 2 and 70 from dispersing into the atmosphere. The housing 90 is provided with a draft port 91a for collecting the escaped vapors and gasses. The escaped vapors and gasses in the housing 90 are drawn through a draft pipe 91 connected with the draft port 91a into a draft chamber (not shown) and are collected there. Also, as with the embodiment of FIG. 1, the reservoir tanks 15a–15c are confined within another housing 38 schematically shown by the box of imaginary lines in FIG. 7, in order to prevent the vapors of the washing liquids from escaping out of the tanks 15a–15c and dispersing into the atmosphere. The escaped vapors in the housing 38 are drawn through a draft pipe 39 connected with a draft port 39a into a draft chamber (not shown) and are collected there.

Next, an exemplified washing and drying operation carried out by the washing and drying apparatus of the embodiment of FIG. 7 will be described.

The hermetical door 85 at the top of the hydrophilicity enhancing tank 83 is opened, and the master mask 4, which is the article to be cleaned, is transferred by the master mask transfer unit 31 along the transfer path represented by the dot-and-dash lines 88 to the holder (not shown) disposed at the ultraviolet ray irradiation position in the hydrophilicity enhancing tank 83. When the master mask 4 has been moved in the hydrophilicity enhancing tank 83 and the master mask transfer unit 31 has retreated out of the tank 83, the hermetical door 85 is closed and the tank 83 is hermetically sealed.

Then, the draft valve 28a of the draft pipe 28 provided at the bottom wall of the hydrophilicity enhancing tank 83 is opened, and the gasses in the tank 83 is drawn out of the tank 83 by the activation of the gas drawer unit (not shown) while a gaseous mixture with rich oxygen ($O_2$) and ozone ($O_3$) is introduced through the nozzle 87 at the top wall of the tank 83 into the space 89 within the tank 83.

Following the introduction of the gaseous mixture with rich oxygen and ozone, the ultraviolet lamps 25a and 25b irradiate ultraviolet rays having wavelengths of 185 nm and 254 nm onto the surface of the master mask 4 for a pre-determined time period. During the irradiation, the gaseous mixture with rich oxygen and ozone is continuously injected and the waste gases are continuously drawn out of the hydrophilicity enhancing tank 83.

The oxygen and the ozone in the gaseous mixture are activated by the ultraviolet rays, and in particular, active oxygen (or atomic oxygen) O is liberated from the ozone thereby. By the effects of the active oxygen, the ozone and the ultraviolet rays, the surface of the master mask 4 is modified from a hydrophobic surface into a hydrophilic surface.

After the surface modification, the master mask 4 is transferred by the master mask transfer unit 31, again along the transfer path represented by the dot-and-dash lines 88, out of the hydrophilicity enhancing tank 83. The hermetical door 85 is opened when the master mask 4 is being transferred out of the tank 83, and is closed after the master mask 4 has been transferred out of the tank 83.

The master mask 4, having been transferred out of the hydrophilicity enhancing tank 83, is further transferred to a position just above the scrubbing tank 70 and into the scrubbing tank 70. The following processes are the same as those described in relation to the embodiment of FIG. 6, i.e., the master mask 4 undergoes the scrubbing operation followed by the washing and water-removing drying operation carried out in the washing tank 2.

By using the washing and drying apparatus of the embodiment of FIG. 7, the surface of the master mask 4, which is the article to be cleaned, is made more hydrophilic in the hydrophilicity enhancing tank 83, as the pretreatment for the scrubbing operation carried out in the scrubbing tank 70. This improves the wettability of the surface of the master mask 4, and the removability of the contaminants on the master mask surface as experienced during the scrubbing operation in the scrubbing tank 70 is considerably improved thereby. Thus, any contaminants, which could be otherwise difficult to remove during the washing operation using the azeotropic mixture 1 carried out in the washing tank 2, can be completely removed by the scrubbing operation in the scrubbing tank 70 prior to the washing operation. This basically improves the cleanliness of the master mask 4 even over the possible cleanliness achievable by the embodiment of FIG. 6, as well as enables the selection of the components of the azeotropic mixture 1 to be used in the washing tank 2 from the washing agents which are much more desirable in view of the disaster prevention and the harmlessness to the human health. Further, this embodiment has an advantage over the embodiment of FIG. 6 in that this embodiment can further reduce the contamination of the mixture 1 in the washing tank 2 which could otherwise be caused by the contaminants initially adhering to the surface of the master mask 4, and maintains the cleanliness of the mixture 1, resulting in a much longer life of the mixture 1.

The applications of the washing and drying method and/or the washing and drying apparatus according to the present invention are not limited to the methods and apparatuses used in the field of semiconductor device fabrication for masks, wafers, glass plates, etc., but they may be applied to the methods of and apparatuses for washing and drying an article in any and all industrial fields.

Accordingly, the present invention is not limited to the embodiments shown and described above but may be embodied in various other forms and arrangements without departing from the spirit of the present invention.

The first method of washing and drying an article according to the present invention, unlike the water-removing and drying technique using warm ultrapure water alone, requires no tight control of the temperature of the washing liquid or of the pull rate for pulling up the washed article, and prevents any electrostatical recontamination of the washed article due to its zeta-potential as well as any traces of water mark left on the surface of the dried article. Further, warm ultrapure water has no capability of dissolving grease films and organic dust particulates unlike any of CFCs, alcoholic organic solvents and CFC-substitute solvents. Thus, any organic dust particulates left on the article surface even after the preceding cleaning step(s) can not be removed during the following water-removing and drying step using warm ultrapure water alone. In contrast, the method according to the present invention enables the selection of the component washing liquids for the azeotropic mixture depending on the condition and the properties of the dusts on the surface of the article to be cleaned. The article therefore may be washed and dried very appropriately. Also, because the boiling point of the azeotropic mixture is lower than those of the azeotropic component liquids, the use of the azeotropic mixture is particularly advantageous when it is desired to wash a to-be-cleaned article at a relatively low temperature for some reason, for example, when the material of the article has poor heat resistance.

In the method of washing and drying an article according to the present invention, the washing and drying operation is carried out by using the washing mixture prepared by mixing a plurality of azeotropic component liquids, so that the method provides many advantages over the conventional methods in which an article to be cleaned is washed once using a single-component washing liquid, or washed a plurality of times using different single-component washing liquids. The advantages are as follows.

First, by using the method according to the invention, we can select the component washing liquids for the mixture from those which are harmless to the global environment. Various CFC solvents have been conveniently used as the solvents for water-removing and drying operation so far, because of their excellent characteristics including high drying rate and are not dangerous in respect of fire and explosion; however, the use of CFC solvents is now being completely prohibited because they have been proven to destroy the ozone layer in the atmosphere protecting the earth from the harmful effect of the ultraviolet radiation. Recently, CFC-substitutes and other solvents including petroleum, alcoholic, ketonic and aromatic solvents are being tried as the replacements of CFCs; however, all of them are dangerous in respect of fire and explosion and have limitations relating to the human health. Therefore, those other chemicals which are free from the danger of fire are also being tried, but no satisfactory products in view of health and safety as well as acceptable drying ratio have been developed yet.

Because no remarkable results appear to have been achieved despite the endeavors made during more than a decade by the world's scientists and manufacturers involved, it is not considered that any acceptable products satisfying all the present requisites including production costs can be developed in the near future.

The method of washing and drying an article according to the present invention has been developed in order to at least partially relieve the limitations imposed on the conventional methods. By using the method according to the invention, washing agents may be selected from those which are environment-friendly and relatively harmless to human health.

Where the mixing ratio of the azeotropic mixture is selected depending on the condition of the article to be cleaned, the selection may be advantageously made by exploiting the fact that each of the component ratios of the vapor phase azeotropic mixture and the liquid phase azeotropic mixture both in the washing tank is selectable. For example, if considerable organic dust particulates are expected to be left on the article surface even after the preceding cleaning step(s), such a washing mixture having an increased proportion of alcoholic or ketonic organic solvent may be used so as to enhance the removal of the residual organic dust particulates during the washing operation. On the other hand, if few organic dust particulates are expected to be left after the preceding cleaning step(s), a different washing mixture having reduced proportion of alcoholic or ketonic organic solvent may be used so as to suppress the consumption of such organic solvent.

Where the azeotropic mixture comprises a binary system mixture consisting of water and an alcohol selected from the group of C1–6 alcohols, this results in the presence of water in each of the liquid phase azeotropic mixture and the vapor phase azeotropic mixture, thereby providing the advantage that the danger of fire and explosion is significantly reduced, leading to a safer operation.

Where the azeotropic mixture comprises a ternary system mixture consisting of water, an alcohol selected from the group of C1–6 alcohols and an ether selected from the group of C2–8 ethers, this provides an effect that the danger of fire and explosion is reduced as with the binary system mixture, and further, the mixture's capability of removing organic dusts is enhanced by the inclusion of an ether as one of the components.

In the apparatus for washing and drying an article according to the present invention, an azeotropic mixture is used as the washing mixture and a to-be-cleaned article is washed in vapor phase or liquid phase of the mixture while the concentrations of at least two different azeotropic liquids constituting the mixture are controlled by the mixing means to predetermined concentrations, and then the article is dried, so that the apparatus enables each of the first and second methods according to the present invention to be conveniently carried out. Further, where water is used as one of the component liquids of the azeotropic mixture, there may be provided such an apparatus which requires no costly safe measures such as an intrinsically safe structure, and thus can be constructed at a reduced cost, and provide high performance as well.

The second method of washing and drying an article according to the present invention, as with the first method of washing and drying an article according to the present invention, effectively prevents any electrostatic recontamination of the washed article as well as any traces of water mark remaining on the surface of the dried article, so as to provide the article surface with good conditions. Further, the second method according to the invention requires no adjustment of the washing mixture unlike the first method, thereby providing a much safer operation, reducing the possibility of disaster and making it less harmful to humans.

What is claimed is:

1. A method for washing and drying an article, comprising the steps of:
    providing an azeotropic liquid in a tank, said azeotropic liquid containing water and alcohol having one to six carbon atoms, wherein said azeotropic liquid has an azeotropic point of not more than 100° C. and is substantially free of organic compounds containing at least one of a fluorine atom and chlorine atom;
    providing an article in the tank, said article being disposed above a surface level of the azeotropic liquid;
    heating the azeotropic liquid for producing an azeotropic vapor including water and alcohol having one to six carbon atoms so that the azeotropic vapor washes the article;
    maintaining the azeotropic vapor to have a temperature of not more than 100° C. during the heating step; and
    drying said article.

2. A method of claim 1, further comprising a step of irradiating an ultraviolet ray onto said article prior to said heating step.

3. A method of claim 1, further comprising a step of detecting the surface level of said azeotropic liquid.

4. A method of claim 1, where said azeotropic liquid further comprises an ether having two to eight carbon atoms.

5. A method of claim 1, wherein said azeotropic liquid further comprises diisopropyl ether.

6. A method of claim 1, wherein said azeotropic liquid contains water and isopropyl alcohol.

7. A method of claim 1, wherein said azeotropic liquid contains water, isopropyl alcohol, and diisopropyl ether.

8. A method of claim 1, wherein said azeotropic liquid consists essentially of water and isopropyl alcohol.

9. A method of claim 1, wherein said azeotropic liquid contains about 10 to about 90 percent by weight of isopropyl alcohol based on said azeotropic liquid.

10. A method of claim 1, wherein said azeotropic liquid contains about 30 to about 90 parts by weight of water and about 70 to about 10 parts by weight of isopropyl alcohol.

11. A method of claim 1, wherein said azeotropic liquid contains about 30 to about 70 parts by weight of water and about 70 to about 30 pans by weight of isopropyl alcohol.

12. A method of claim 1, wherein the article comprises at least one of a reticle, a glass substrate, and a master mask.

13. A method of claim 1, wherein the azeotropic vapor is kept to have a temperature not more than 83° C. during the heating step.

14. A method for washing and drying an article, comprising the steps of:
    washing said article at temperature not more than 100° C. by an azeotropic mixture in liquid phase or vapor phase comprising water, alcohol having one to six carbon atoms and ether having two to eight carbon atoms, wherein said azeotropic mixture has an azeotropic point of not more than 100° C. and is substantially free of an organic compound containing at least one of a fluorine atom and a chlorine atom; and
    drying said article.

15. A method of claim 14, wherein said azeotropic mixture in liquid phase or vapor phase consists essentially of water, alcohol having one to six carbon atoms and ether having two to eight carbon atoms.

16. A method of claim 14, further comprising a step of maintaining the azeotropic mixture to have a temperature of not more than 83° C. during the washing step.

17. A method of claim 14, wherein said azeotropic mixture comprises alcohol two to four carbon atoms and ether having five to eight carbon atoms.

18. A method of claim 14, wherein said azeotropic mixture comprises isopropyl alcohol and diisopropyl ether.

* * * * *